US012665036B2

(12) United States Patent
Wang

(10) Patent No.: US 12,665,036 B2
(45) Date of Patent: Jun. 23, 2026

(54) METHODS OF OPERATING MEMORIES, MEMORIES AND MEMORY SYSTEMS

(71) Applicant: YANGTZE MEMORY TECHNOLOGIES CO., LTD., Wuhan (CN)

(72) Inventor: Yan Wang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 127 days.

(21) Appl. No.: 18/816,949

(22) Filed: Aug. 27, 2024

(65) Prior Publication Data

US 2025/0356926 A1     Nov. 20, 2025

(30) Foreign Application Priority Data

May 15, 2024    (CN) .......................... 202410606483.3

(51) Int. Cl.
 *G11C 16/26* (2006.01)
 *G11C 16/04* (2006.01)
(52) U.S. Cl.
 CPC .......... *G11C 16/26* (2013.01); *G11C 16/0483* (2013.01)
(58) Field of Classification Search
 CPC . G11C 16/26; G11C 16/0483; G11C 11/5642; G11C 16/32

USPC ...................................................... 365/185.18
See application file for complete search history.

(56) References Cited

U.S. PATENT DOCUMENTS

2020/0098434 A1 *   3/2020   Lang ...................... G11C 16/26
2024/0264288 A1 *   8/2024   Lee ........................... G06T 5/50

FOREIGN PATENT DOCUMENTS

CN             117877553 A   *   4/2024   ............. G11C 16/26

* cited by examiner

*Primary Examiner* — Fernando Hidalgo
(74) *Attorney, Agent, or Firm* — Conley Rose, P.C.

(57)            ABSTRACT

The present application provides methods of operating memories, memories and memory systems. An example method includes: at a first reading period, performing a sensing operation on memory cells based on a first read voltage, a sensing development duration for the sensing operation performed on the memory cells being not shorter than a first development duration. Based on different sensing development durations, at a first sensing period and a second sensing period of the first reading period, a number of first memory cell, a number of second memory cell and a number of third memory cell are obtained. Based on the number of first memory cell, the number of second memory cell and the number of third memory cell, a valley voltage between a first threshold voltage distribution range and a second threshold voltage distribution range is determined.

20 Claims, 22 Drawing Sheets

At a first reading stage, a sensing operation is performed on a plurality of memory cells based on a first read voltage    S100

At a second reading stage, a sensing operation is performed on the plurality of memory cells based on a second read voltage different from the first read voltage    S200

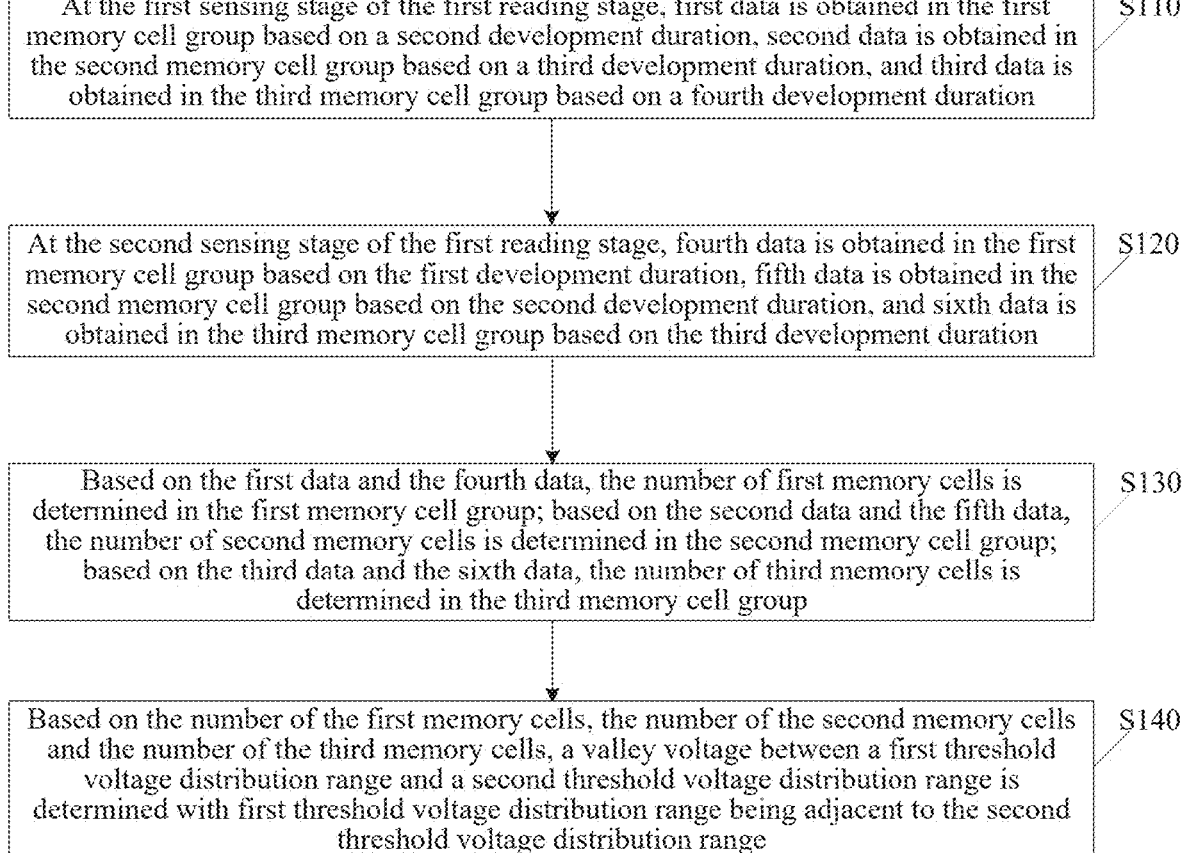

At the first sensing stage of the first reading stage, first data is obtained in the first memory cell group based on a second development duration, second data is obtained in the second memory cell group based on a third development duration, and third data is obtained in the third memory cell group based on a fourth development duration — S110

At the second sensing stage of the first reading stage, fourth data is obtained in the first memory cell group based on the first development duration, fifth data is obtained in the second memory cell group based on the second development duration, and sixth data is obtained in the third memory cell group based on the third development duration — S120

Based on the first data and the fourth data, the number of first memory cells is determined in the first memory cell group; based on the second data and the fifth data, the number of second memory cells is determined in the second memory cell group; based on the third data and the sixth data, the number of third memory cells is determined in the third memory cell group — S130

Based on the number of the first memory cells, the number of the second memory cells and the number of the third memory cells, a valley voltage between a first threshold voltage distribution range and a second threshold voltage distribution range is determined with first threshold voltage distribution range being adjacent to the second threshold voltage distribution range — S140

FIG. 10

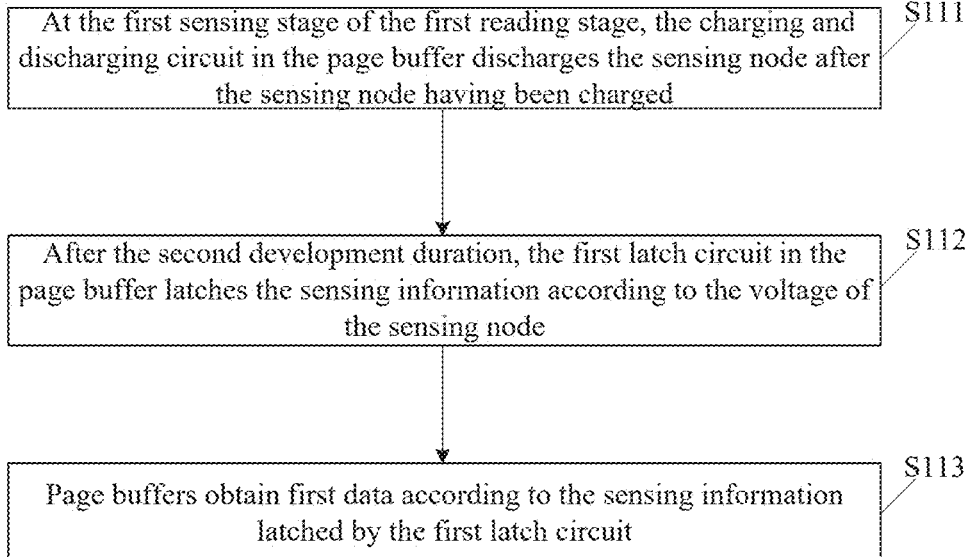

At the first sensing stage of the first reading stage, the charging and discharging circuit in the page buffer discharges the sensing node after the sensing node having been charged — S111

After the second development duration, the first latch circuit in the page buffer latches the sensing information according to the voltage of the sensing node — S112

Page buffers obtain first data according to the sensing information latched by the first latch circuit — S113

FIG. 12

METHODS OF OPERATING MEMORIES, MEMORIES AND MEMORY SYSTEMS

CROSS-REFERENCE TO RELATED APPLICATIONS

The present application claims priority to Chinese Patent Application No. 202410606483.3, which was filed May 15, 2024, and is hereby incorporated herein by reference in its entirety.

TECHNICAL FIELD

The present application relates to the field of semiconductor chip technology, and in examples, to methods of operating memories, memories and memory systems.

BACKGROUND

A flash is a memory having characteristics such as non-volatile, a high reading/writing speed, low power consumption and a long service life, and can be applied in various electronic products such as a mobile phone, a computer, a smart sensor and a locating device. With demands of consumers for higher performance and reliability of electronic products, the market has put forward higher requirements for the reading speed, writing (also known as programming) speed, and service life of flash (memory).

SUMMARY

In a first aspect, the present application provides a method of operating a memory. The method includes: at a first reading period, performing a sensing operation on memory cells based on a first read voltage, a sensing development duration for the sensing operation performed on the memory cells being not shorter than a first development duration. The memory cells include a first memory cell group, a second memory cell group and a third memory cell group. Here, at a first sensing period of the first reading period, first data is obtained in the first memory cell group based on a second development duration, second data is obtained in the second memory cell group based on a third development duration, and third data is obtained in the third memory cell group based on a fourth development duration. At a second sensing period of the first reading period, fourth data is obtained in the first memory cell group based on the first development duration, fifth data is obtained in the second memory cell group based on the second development duration, and sixth data is obtained in the third memory cell group based on the third development duration. Based on the first data and the fourth data, the number of first memory cell is determined in the first memory cell group with a threshold voltage of the first memory cell being between a first voltage and a second voltage. Based on the second data and the fifth data, the number of second memory cell is determined in the second memory cell group with a threshold voltage of the second memory cell being between the second voltage and a third voltage. Based on the third data and the sixth data, the number of third memory cell is determined in the third memory cell group with a threshold voltage of the third memory cell being between the third voltage and a fourth voltage. Based on the number of the first memory cell, the number of the second memory cell and the number of the third memory cell, a valley voltage between a first threshold voltage distribution range and a second threshold voltage distribution range is determined with the first threshold voltage distribution range being adjacent to the second threshold voltage distribution range.

In some possible implementations, the method further includes: at a second reading period, performing a sensing operation on the memory cells based on a second read voltage different from the first read voltage.

In some possible implementations, at the second reading period, the sensing operation on the memory cells having threshold voltages not larger than the second voltage in the first memory cell group is prohibited; or the sensing operation on the memory cells having threshold voltages not larger than the first voltage in the first memory cell group is prohibited.

In some possible implementations, at the second reading period, the sensing operation on the memory cells having threshold voltages not larger than the third voltage in the second memory cell group is prohibited; or the sensing operation on the memory cells having threshold voltages not larger than the second voltage in the second memory cell group is prohibited.

In some possible implementations, at the second reading period, the sensing operation on the memory cells having threshold voltages not larger than the fourth voltage in the third memory cell group is prohibited; or the sensing operation on the memory cells having threshold voltages not larger than the third voltage in the third memory cell group is prohibited.

In some possible implementations, the memory includes a page buffer coupled to the memory cells in the first memory cell group. Obtaining the first data further includes: at the first sensing period of the first reading period, discharging a sensing node in the page buffer after the sensing node have been charged. After the second development duration, sensing information is latched into a first latch circuit in the page buffer according to the voltage of the sensing node. The first data is obtained according to the sensing information latched by the first latch circuit.

In some possible implementations, obtaining the fourth data further includes: at the second sensing period of the first reading period, discharging the sensing node after the sensing node have been charged. After the first development duration, sensing information is latched into a second latch circuit of the page buffer according to the voltage of the sensing node. The fourth data is obtained according to the sensing information latched by the second latch circuit.

In some possible implementations, the memory includes a page buffer coupled to the memory cells in the second memory cell group. Determining the number of the second memory cell in the second memory cell group further includes: at the first sensing period of the first reading period, discharging a sensing node in the page buffer after the sensing node have been charged; after the third development duration, sensing information is latched into a first latch circuit of the page buffer according to the voltage of the sensing node to obtain the second data. At the second sensing period of the first reading period, the sensing node are discharged after the sensing node have been charged; after the second development duration, sensing information is latched into a second latch circuit of the page buffer according to the voltage of the sensing node to obtain the fifth data. The number of the second memory cell is determined according to the second data and the fifth data.

In some possible implementations, the memory includes the page buffer coupled to the memory cells in the first memory cell group. At the second reading period, the sensing operation on the memory cells having threshold voltages not larger than the second voltage in the first memory cell group is prohibited, or the sensing operation on the memory cells having threshold voltages not larger than the first voltage in the first memory cell group is prohibited, which further includes: at the first sensing period of the first reading period, discharging the sensing node in the page buffer after the sensing node have been charged; after the second development duration, latching sensing information into the first latch circuit of the page buffer according to the voltage of the sensing node. At the second sensing period of the first reading period, the sensing node are discharged after the sensing node have been charged; after the first development duration, sensing information is latched into the second latch circuit of the page buffer according to the voltage of the sensing node. At the second reading period, the sensing node is prohibited from being charged according to the sensing information latched by the first latch circuit; or the sensing node is prohibited from being charged according to the sensing information latched by the second latch circuit.

In some possible implementations, the memory includes the page buffer coupled to the memory cells in the second memory cell group. At the second reading period, the sensing operation on the memory cells having threshold voltages not larger than the third voltage in the second memory cell group is prohibited, or the sensing operation on the memory cells having threshold voltages not larger than the second voltage in the second memory cell group is prohibited, which further includes: at the first sensing period of the first reading period, discharging the sensing node in the page buffer after the sensing node have been charged; after the third development duration, latching sensing information into the first latch circuit of the page buffer according to the voltage of the sensing node. At the second sensing period of the first reading period, the sensing node are discharged after the sensing node have been charged; after the second development duration, sensing information is latched into the second latch circuit of the page buffer according to the voltage of the sensing node. At the second reading period, the sensing node is prohibited from being charged according to the sensing information latched by the first latch circuit; or the sensing node is prohibited from being charged according to the sensing information latched by the second latch circuit.

In some possible implementations, at the second reading period, the sensing node is prohibited from being charged according to the sensing information latched by the first latch circuit; or the sensing node is prohibited from being charged according to the sensing information latched by the second latched, which further includes: at the first sensing period of the first reading period, latching the sensing information latched by the first latch circuit into a third latch circuit in the page buffer; before the second read operation, transferring the sensing information latched by the third latch circuit back to the first latch circuit; or, at the first sensing period of the first reading period, latching the sensing information latched by the second latch circuit into the third latch circuit; before the second reading period, transferring the sensing information latched by the third latch circuit to the first latch circuit. At the second reading period, the sensing node is prohibited from being charged according to the sensing information latched by the first latch circuit.

In some possible implementations, the method further includes: at the second reading period, prohibiting the sensing operation on the memory cells having threshold voltages larger than the second voltage in the first memory cell group; or prohibiting the sensing operation on the memory cells having threshold voltages larger than the first voltage in the first memory cell group.

In some possible implementations, the method further includes: at the second reading period, prohibiting the sensing operation on the memory cells having threshold voltages larger than the third voltage in the second memory cell group; or prohibiting the sensing operation on the memory cells having threshold voltages larger than the second voltage in the second memory cell group.

In some possible implementations, the method further includes: at the second reading period, prohibiting the sensing operation on the memory cells having threshold voltages larger than the fourth voltage in the third memory cell group; or prohibiting the sensing operation on the memory cells having threshold voltages larger than the third voltage in the third memory cell group.

In some possible implementations, the method further includes: at the second reading period, the sensing development duration for the sensing operation performed on the memory cells is not shorter than a fifth development duration. Here, at the first sensing period of the second reading period, seventh data is obtained in the first memory cell group based on a sixth development duration, eighth data is obtained in the second memory cell group based on a seventh development duration, and ninth data is obtained in the third memory cell group based on an eighth development duration. At the second sensing period of the second reading period, tenth data is obtained in the first memory cell group based on the fifth development duration, eleventh data is obtained in the second memory cell group based on the sixth development duration, and twelfth data is obtained in the third memory cell group based on the seventh development duration. Based on the seventh data and the tenth data, the number of the fourth memory cell is determined in the first memory cell group with threshold voltage of the fourth memory cell being between a fifth voltage and a sixth voltage. Based on the eighth data and the eleventh data, the number of the fifth memory cell is determined in the second memory cell group with threshold voltage of the fifth memory cell being between the sixth voltage and a seventh voltage. Based on the ninth data and the twelfth data, the number of the sixth memory cell is determined in the third memory cell group with threshold voltage of the sixth memory cell being between the seventh voltage and an eighth voltage. Based on the number of the fourth memory cell, the number of the fifth memory cell and the number of the sixth memory cell, a valley voltage between a third threshold voltage distribution range and a fourth threshold voltage distribution range is determined with the third threshold voltage distribution range being adjacent to the fourth threshold voltage distribution range.

In a second aspect, the present application provides a memory. The memory includes a memory array and a peripheral circuit coupled to the memory array, where the memory array includes memory cell(s) and a word line coupled to the memory cell. The peripheral circuit is configured to: at a first reading period, perform a sensing operation on memory cells based on a first read voltage, a sensing development duration for the sensing operation performed on the memory cells being not shorter than a first development duration. The memory cells include a first memory cell group, a second memory cell group and a third memory cell group. At a first sensing period of the first reading period, first data is obtained in the first memory cell group based on a second development duration, second data is obtained in the second memory cell group based on a third development duration, and third data is obtained in the third memory cell group based on a fourth development duration. At the second sensing period of the first reading period, fourth data is obtained in the first memory cell group based on the first development duration, fifth data is obtained in the second memory cell group based on the second development duration, and sixth data is obtained in the third memory cell group based on the third development duration. Based on the first data and the fourth data, the number of first memory cell is determined in the first memory cell group with the threshold voltage of the first memory cell being between a first voltage and a second voltage. Based on the second data and the fifth data, the number of second memory cell is determined in the second memory cell group with the threshold voltage of the second memory cell being between the second voltage and a third voltage. Based on the third data and the sixth data, the number of third memory cell is determined in the third memory cell group with the threshold voltage of the third memory cell being between the third voltage and a fourth voltage. Based on the number of the first memory cell, the number of the second memory cell and the number of the third memory cell, a valley voltage between a first threshold voltage distribution range and a second threshold voltage distribution range is determined with the first threshold voltage distribution range being adjacent to the second threshold voltage distribution range.

In some possible implementations, the peripheral circuit is further configured to: at a second reading period, perform a sensing operation on the memory cells based on a second read voltage different from the first read voltage.

At the second reading period, the peripheral circuit is further configured to: prohibit the sensing operation on the memory cells having threshold voltages not larger than the second voltage in the first memory cell group; or prohibit the sensing operation on the memory cells having threshold voltages not larger than the first voltage in the first memory cell group.

In some possible implementations, the peripheral circuit is further configured to: at the second reading period, prohibit the sensing operation on the memory cells having threshold voltages not larger than the third voltage in the second memory cell group; or prohibit the sensing operation on the memory cells having threshold voltages not larger than the second voltage in the second memory cell group.

In some possible implementations, the peripheral circuit is further configured to: at the second reading period, prohibit the sensing operation on the memory cells having threshold voltages not larger than the fourth voltage in the third memory cell group; or prohibit the sensing operation on the memory cells having threshold voltages not larger than the third voltage in the third memory cell group.

In some possible implementations, the peripheral circuit includes a page buffer coupled to the memory cells of the first memory cell group, where the page buffer includes a sensing node, a charging and discharging circuit and a first latch circuit with the charging and discharging circuit and the first latch circuit being coupled to the sensing node. At the first sensing period of the first reading period, the charging and discharging circuit is configured to discharge the sensing node after the sensing node have been charged. The first latch circuit is configured to latch sensing information according to the voltage of the sensing node after the second development duration; the first data is obtained according to the sensing information latched by the first latch circuit.

In some possible implementations, the page buffer further includes a second latch circuit coupled to the sensing node.

The page buffer is further configured to: at the second sensing period of the first reading period, the charging and discharging circuit is configured to discharge the sensing node after the sensing node have been charged. The second latch circuit is configured to latch sensing information according to the voltage of the sensing node after the first development duration; the fourth data is obtained according to the sensing information latched by the second latch circuit.

In some possible implementations, the peripheral circuit include the page buffer coupled to the memory cells in the second memory cell group. The page buffer includes a sensing node, a charging and discharging circuit, a first latch circuit and a second latch circuit with the charging and discharging circuit, the first latch circuit and the second latch circuit being coupled to the sensing node. At the first sensing period of the first reading period, the charging and discharging circuit is configured to discharge the sensing node after the sensing node have been charged; the first latch circuit is configured to latch sensing information according to the voltage of the sensing node after the third development duration to obtain the second data. At the second sensing period of the first reading period, the charging and discharging circuit is configured to discharge the sensing node after the sensing node have been charged; the second latch circuit is configured to latch sensing information according to the voltage of the sensing node after the second development duration to obtain the fifth data. The number of the second memory cell is determined according to the second data and the fifth data.

In some possible implementations, the peripheral circuit include the page buffer coupled to the memory cells in the first memory cell group. The page buffer includes a sensing node, a first latch circuit, a second latch circuit, and a charging and discharging circuit, with the first latch circuit, the second latch circuit and the charging and discharging circuit being coupled to the sensing node. At the first sensing period of the first reading period, the charging and discharging circuit is configured to discharge the sensing node in the page buffer after the sensing node have been charged; the first latch circuit is configured to latch sensing information according to the voltage of the sensing node after the second development duration. At the second sensing period of the first reading period, the charging and discharging circuit discharges the sensing node after the sensing node have been charged; after the first development duration, sensing information is latched into the second latch circuit of the page buffer according to the voltage of the sensing node. At the second reading period, the sensing node is prohibited from being charged according to the sensing information latched by the first latch circuit; or the sensing node is prohibited from being charged according to the sensing information latched by the second latch circuit.

In some possible implementations, the peripheral circuit includes a page buffer coupled to the memory cells in the second memory cell group. The page buffer includes a sensing node, a first latch circuit, a second latch circuit, and a charging and discharging circuit, with the first latch circuit, the second latch circuit and the charging and discharging circuit being coupled to the sensing node. At the first sensing period of the first reading period, the charging and discharging circuit is configured to discharge the sensing node in the page buffer after the sensing node have been charged; the first latch circuit is configured to latch sensing information according to the voltage of the sensing node after the third development duration. At the second sensing period of the first reading period, the charging and discharging circuit discharges the sensing node after the sensing node have been charged; after the second development duration, sensing information is latched into the second latch circuit of the page buffer according to the voltage of the sensing node. At the second reading period, the sensing node is prohibited from being charged according to the sensing information latched by the first latch circuit; or the sensing node is prohibited from being charged according to the sensing information latched by the second latch circuit.

In some possible implementations, the page buffer includes a third latch circuit coupled to the sensing node and the first latch circuit is coupled to the charging and discharging circuit. At the first sensing period of the first reading period, the third latch circuit is configured to latch the sensing information latched by the first latch circuit; before the second reading period, the third latch circuit is configured to transfer the latched sensing information to the first latch circuit. Or at the first sensing period of the first reading period, the third latch circuit is configured to latch the sensing information latched by the second latch circuit; before the second reading period, the third latch circuit is configured to transfer the latched sensing information to the first latch circuit. At the second reading period, the first latch circuit is configured to control the charging and discharging circuit to charge the sensing node according to the sensing information latched by the first latch circuit.

In some possible implementations, the peripheral circuit is further configured to: at the second reading period, prohibit the sensing operation on the memory cells having threshold voltages larger than the second voltage in the first memory cell group; or prohibit the sensing operation on the memory cells having threshold voltages larger than the first voltage in the first memory cell group.

In some possible implementations, the peripheral circuit is further configured to: at the second reading period, prohibit the sensing operation on the memory cells having threshold voltages larger than the third voltage in the second memory cell group; or prohibit the sensing operation on the memory cells having threshold voltages larger than the second voltage in the second memory cell group.

In some possible implementations, the peripheral circuit is further configured to: at the second reading period, prohibit the sensing operation on the memory cells having threshold voltages larger than the fourth voltage in the third memory cell group; or prohibit the sensing operation on the memory cells having threshold voltages larger than the third voltage in the third memory cell group.

In some possible implementations, the peripheral circuit is further configured to: at the second reading period, the sensing development duration for the sensing operation performed on the memory cells being not shorter than a fifth development duration. Here, at the first sensing period of the second reading period, seventh data is obtained in the first memory cell group based on a sixth development duration, eighth data is obtained in the second memory cell group based on a seventh development duration, and ninth data is obtained in the third memory cell group based on an eighth development duration. At the second sensing period of the second reading period, tenth data is obtained in the first memory cell group based on the fifth development duration, eleventh data is obtained in the second memory cell group based on the sixth development duration, and twelfth data is obtained in the third memory cell group based on the seventh development duration. Based on the seventh data and the tenth data, the number of the fourth memory cell is determined in the first memory cell group with threshold voltage of the fourth memory cell being between a fifth voltage and a sixth voltage. Based on the eighth data and the eleventh data, the number of the fifth memory cell is determined in the second memory cell group with threshold voltage of the fifth memory cell being between the sixth voltage and a seventh voltage. Based on the ninth data and the twelfth data, the number of the sixth memory cell is determined in the third memory cell group with threshold voltage of the sixth memory cell being between the seventh voltage and an eighth voltage. Based on the number of the fourth memory cell, the number of the fifth memory cell and the number of the sixth memory cell, a valley voltage between a third threshold voltage distribution range and a fourth threshold voltage distribution range is determined with the third threshold voltage distribution range being adjacent to the fourth threshold voltage distribution range.

In a third aspect, a memory system is provided, which includes a memory controller and the memory in the above-described second aspect. The memory controller is coupled to memory and configured to control the memory.

In a fourth aspect, a computer readable storage medium is provided, which stores computer executable instructions; the computer executable instructions, when being executed, can implement any one of the methods in the above described first aspect.

In a fifth aspect, a computer device is provided, which includes a processor and a readable storage medium coupled with the processor. The readable storage medium stores executable instructions, which, when executed by the processor, can implement any one of the methods in the above described first aspect.

BRIEF DESCRIPTION OF THE DRAWINGS

In order to explain technical solutions in the present application more clearly, accompanying drawings required by some examples of the present application will be described briefly hereafter. It is obvious that the drawings described below are only drawings for some examples of the present application and other drawings can be obtained according to those drawings by those skilled in the art. Moreover, the accompanying drawings described below may be considered as schematic diagrams and mean no limitation on actual sizes of a product, the actual flow of a method, actual timing of signals involved in examples of the present application.

FIG. 10 is a flow chart illustrating operation S100 of the method provided in an example of the present application.

FIG. 12 is a flow chart illustrating operation S110 of the method provided in an example of the present application.

DETAILED DESCRIPTION

Technical solutions in some examples of the present application will be described below in connection with FIGS. 1 to 22. It is obvious that the examples to be described are only some, not all, examples of the present application. All other examples obtained by those skilled in the art based on the examples provided in the present application fall within the scope claimed by the present application.

In the whole specification and claims, the term "include" or "comprise" should be interpreted to be open and inclusive, e.g., to have the meaning of "include or comprise, but not limited to", unless indicated otherwise in the context. In the description of the specification, terms "one example", "some examples", "example implementations", "illustratively" or "some implementations" are intended to mean that particular features, structures, materials or characteristics related to the example(s) or implementation(s) are included in at least one example or implementation of the present application. The expression by the above-mentioned terms may not necessarily refer to one and the same example or implementation. Moreover, the particular features, structures, materials or characteristics may be included in one or more examples or implementations in any suitable way.

Hereafter, the terms "first", "second" etc. are only used for the purpose of description and should not be understood to indicate or imply relative importance or to designate the number of the referenced technical features implicitly. Therefore, a feature being qualified by "first" or "second" may indicate explicitly or implicitly that one or more instances of the feature are included. In description of examples of the present application, the term "a plurality of" or "multiple" means two or more unless otherwise specified.

In description of some examples, the term "couple" and its derivative expressions may be used. For example, in description of some examples, the term "couple" may be used to indicate that two or more components are in direct physical or electrical contact. In this case, the term "couple" can also be replaced by the term "connect". Furthermore, the term "couple" may also indicate that two or more components are not in direction contact with each other, but still cooperate or interact. Examples disclosed herein are not necessarily limited to the contents provided herein.

The use of "configured to" herein has an open and inclusive meaning and is not intended to exclude that a device is suitable for additional tasks or operations or configured to perform additional tasks or operations.

Figure 1:
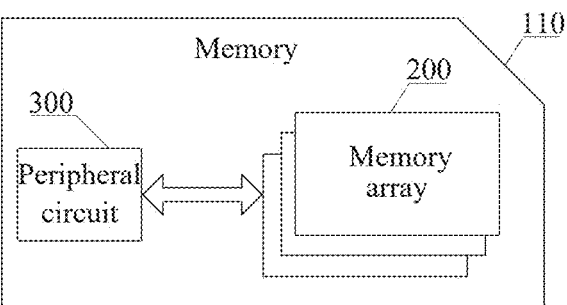
FIG. 1 is a structural diagram of a memory provided in an example of the present application.

FIG. 1 illustrates a structural diagram of a memory provided in an implementation of the present application. As shown in FIG. 1, a memory 110 may include a memory array 200 and a peripheral circuit 300 coupled to the memory array 200. In some implementations, the peripheral circuit 300 and the memory array 200 may be fabricated on two wafers using different fabrication processes and then the two wafers are bonded to each other to bond the peripheral circuit 300 and the memory array 200 together.

Figure 2:
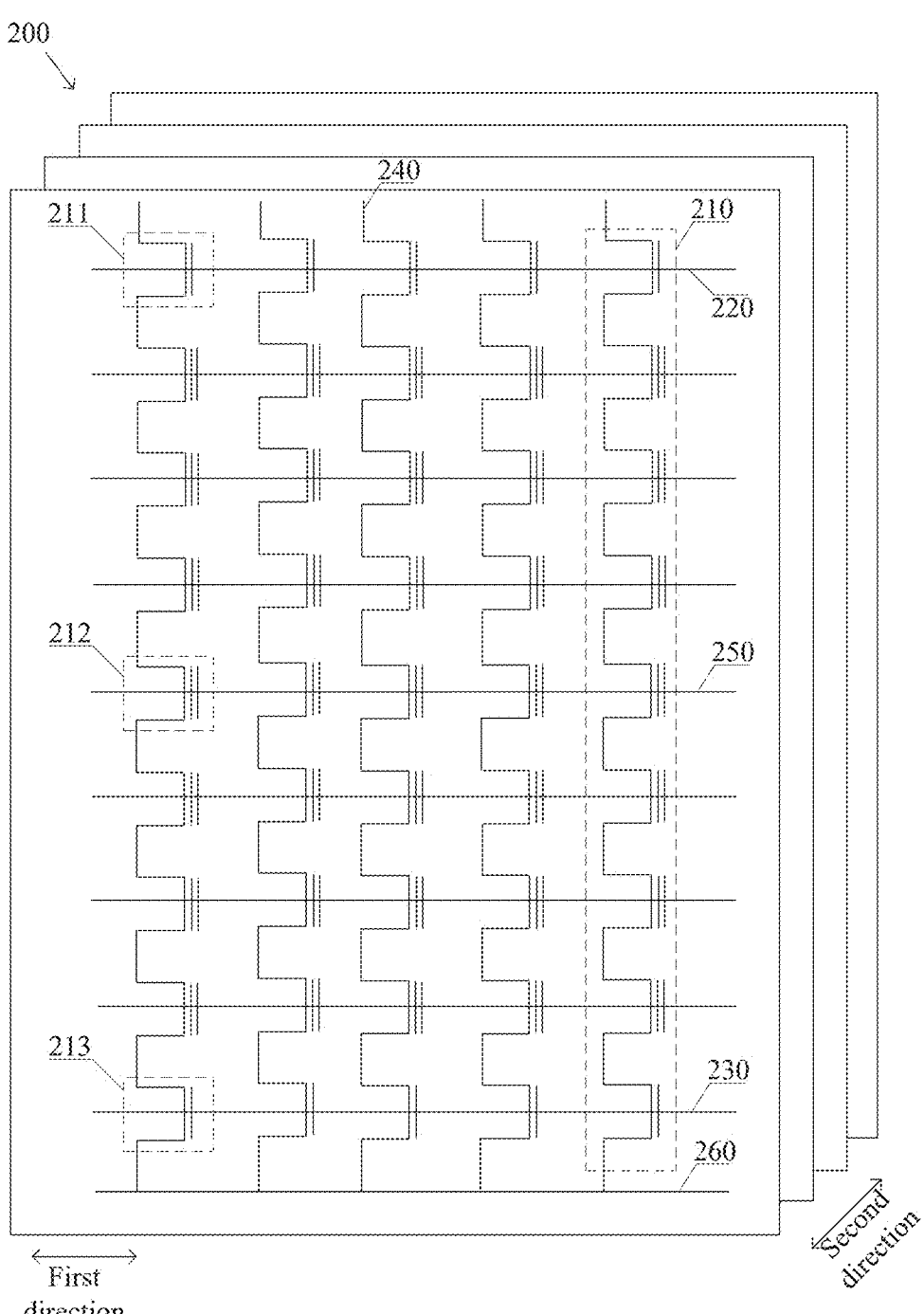
FIG. 2 is a structural diagram of a memory array provided in an example of the present application.

As shown in FIG. 2, the memory array 200 may include memory blocks. A memory block may include memory strings 210, each of which may include a top select gate (TSG) 211, memory cells 212 and a bottom select gate (BSG) 213 stacked sequentially. In an example of the present application, the memory cells 212 may be devices, which can be electrically erased and reprogrammed, such as transistors of a floating gate type or FETs of a charge trap type.

Figure 3:
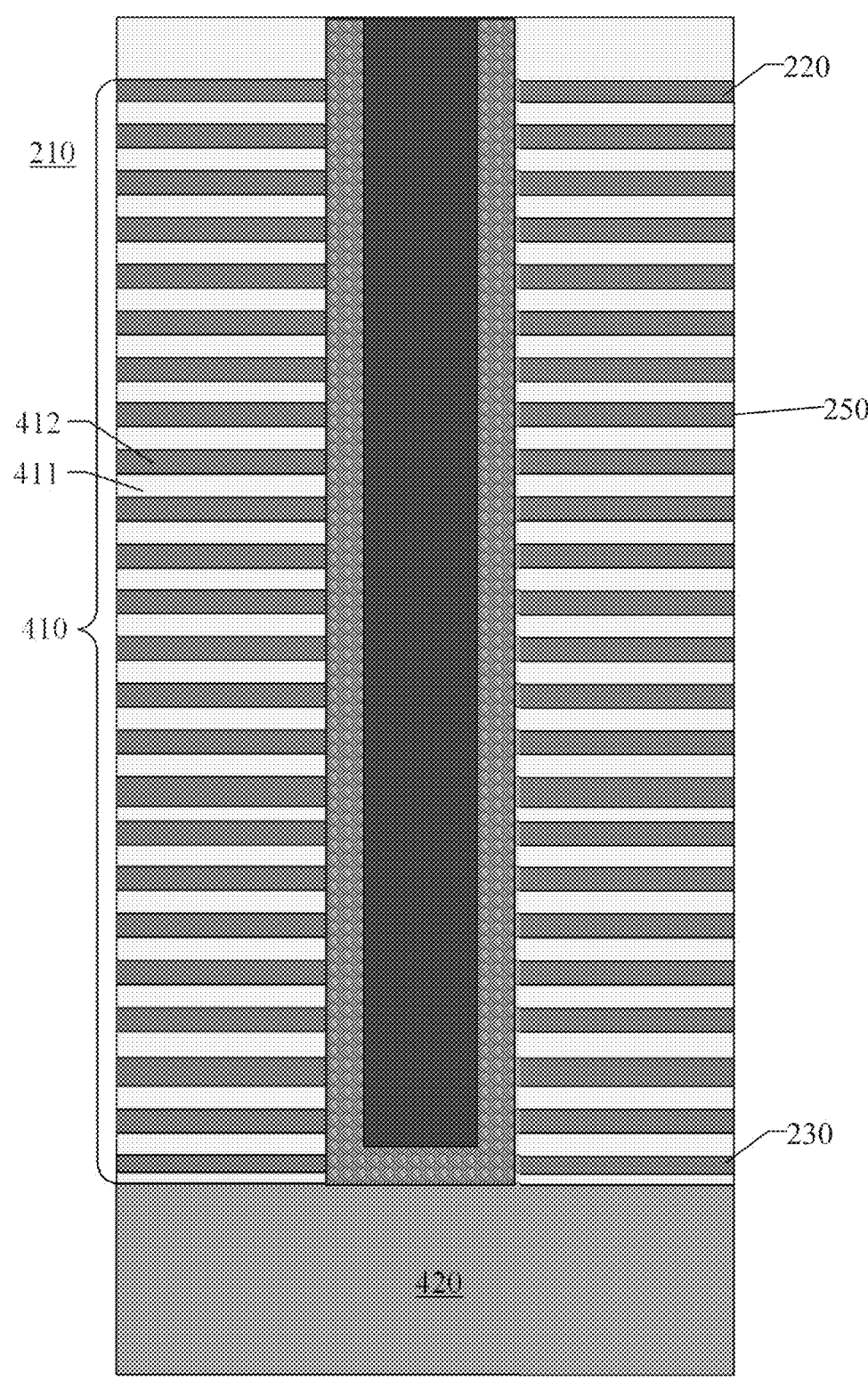
FIG. 3 is a partial cross-sectional diagram of a memory string provided in an example of the present application.

FIG. 3 illustrates a partial cross-sectional diagram of a possible memory string. The memory string 210 may extend vertically through a memory stack 410 above a substrate 420. The substrate 420 may include silicon (e.g., single crystal silicon), silicon germanium (SiGe), gallium arsenide (GaAs), germanium (Ge), silicon on insulator (SOI), germanium on insulator (GOI) or any other suitable material.

The memory stack 410 may include alternating gate conductive layers 411 and dielectric layers 412. The number of the gate conductive layers 411 and the dielectric layers 412 in the memory stack 410 is related to the number of memory cells 212 in the memory string 210.

The gate conductive layers 411 may include a conductive material, which includes, but not limited to, tungsten (W), cobalt (Co), copper (Cu), aluminum (Al), polysilicon, doped silicon, silicide or any combination thereof. In some implementations, each gate conductive layer 411 includes a metal layer, for example, a tungsten layer. In some implementations, each gate conductive layer 411 includes a doped polysilicon layer. Each gate conductive layer 411 may include control gates surrounding memory cells 212, the gate conductive layer 411 at the top of the memory stack 410 may extend laterally as a top select line 220, the gate conductive layer 411 at the bottom of the memory stack 410 may extend laterally as a bottom select line 230, and the gate conductive layers 411 between the top select line 220 and the bottom select line 230 may extend laterally as word lines 250.

In some examples, although not shown in FIG. 3, additional components for the memory string 210 may be formed and may include, but not limited to, gate line slits/source contacts, local contacts, interconnection layers etc.

As shown in FIG. 2, memory strings 210 may be arranged in a row along a first direction and rows of memory strings 210 may be arranged in a second direction perpendicular to the first direction to form a memory block. In some examples, in the same row of memory strings 210, the gate of the top select gate 211 of each memory string 210 may be coupled to the same top select line 220; in some examples, the gates of the top select gates 211 of some rows of memory strings 210 of the rows of memory strings 210 may be coupled to the same top select line 220; the memory strings 210 having the gates of their top select gates 211 coupled to the same top select line 220 may form a memory tile. The gate of the bottom select gate 213 of each memory string 210 may be coupled to the same bottom select line 230. In some implementations, the selected memory strings 210 may be activated through the top select line 220 and the bottom select line 230 during a read operation and a program operation.

Each memory string 210 may be coupled to the peripheral circuit 300 through a corresponding bit line (BL) 240. For example, the drain of the top select gate 211 of the memory string 210 is coupled to the bit line 240. In order to reduce the number of bit lines 240, the memory strings 210 in any memory tile may be coupled to the same bit line 240 as the memory strings 210 at the corresponding location in other memory tiles.

For memory strings 210 in a memory block, the control gate of a memory cell 212 of any memory string 210 may be coupled to the same word line 250 as the control gates of the memory cells 212 at the corresponding location in other memory strings 210. The source of the bottom select gate 213 of the memory string 210 may be coupled to a common select line (CSL) 260, which is also referred to as an array common source (ACS).

Accompanying drawings of the present application only shows the structure of memory block in some examples illustratively and structure of memory blocks may also be in other manner in practice.

Figure 4:
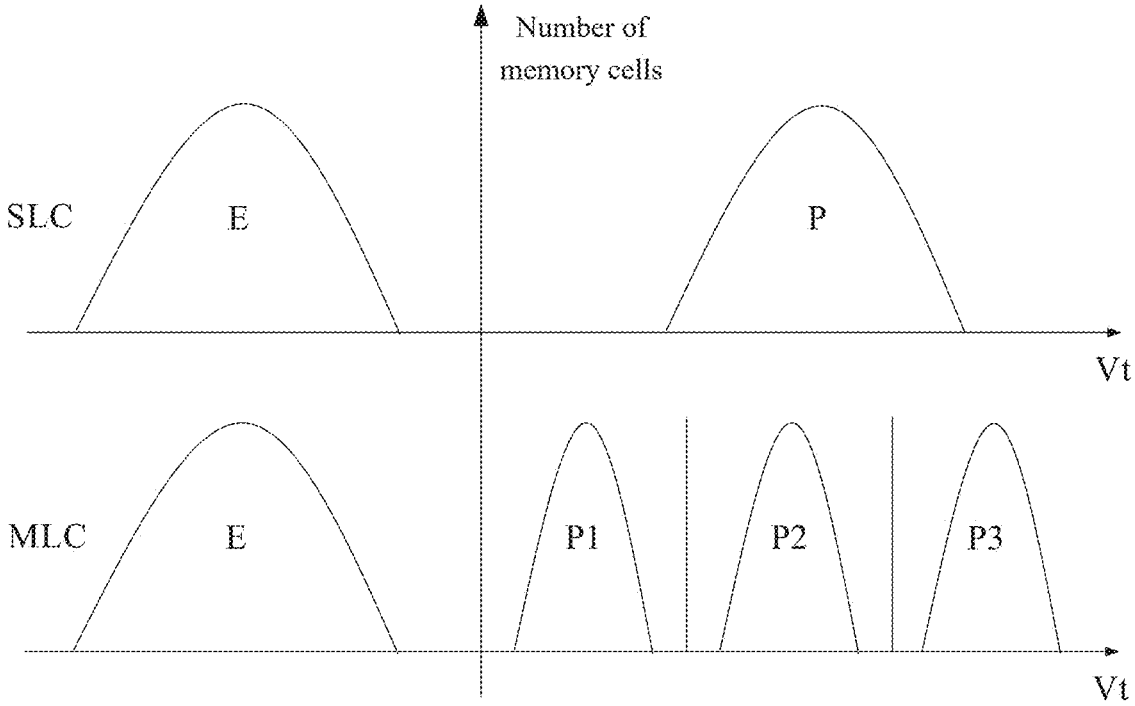
FIG. 4 is a diagram illustrating a threshold voltage distribution of a memory cell provided in an example of the present application.

As shown in FIG. 4, storage modes of a memory cell 212 may include a single-level cell (SLC) mode and a multi-level cell (MLC) mode. Here, a memory cell 212 using a single-level cell mode may store one bit and may have two states, e.g., one erase (E) state and one program (P) state. A memory cell 212 using a multi-level cell mode may store two or more bits and may have four or more states. For example, a memory cell 212 may use a 2-level cell mode and thus store two bits and have four states, e.g., three program states (e.g., the P1 state, P2 state and P3 state in FIG. 4) and one erase state (e.g., the E state in FIG. 4), or a memory cell 212 may use a triple-level cell mode, and thus store three bits and have eight states. In some implementations, each state of a memory cell 212 has a corresponding threshold voltage distribution range.

The peripheral circuit 300 is configured to control the memory array 200. In some implementations, the peripheral circuit 300 is configured to perform a program operation, an erase operation, a read operation and the like on the memory cells 212 in the memory array 200. In some examples, the peripheral circuit 300 may enable a memory cell 212 to store a charge through a program operation and remove or neu-tralize the charge stored in the memory cell 212 through an erase operation. The electric field generated by the charge can influence the threshold voltage (Vt) of the memory cell 212. Generally, the larger the charge stored in the memory cell 212, the higher the threshold voltage of the memory cell 212 is. For example, the peripheral circuit 300 can control an amount of the charge stored in the memory cell 212 of the memory array 200 through a program operation and an erase operation to enable the memory cell 212 achieving a desired threshold voltage distribution range, e.g., to program the memory cell 212 into a desired state.

Figure 5:
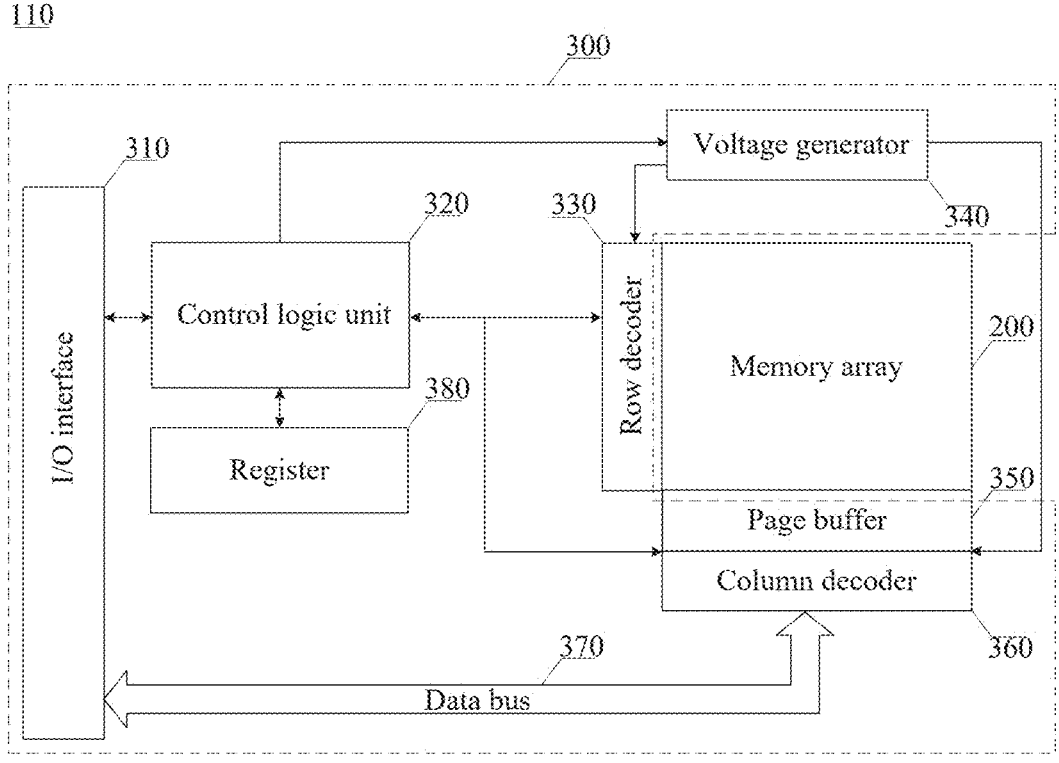
FIG. 5 is a structural diagram illustrating a memory and a peripheral circuit provided in an example of the present application.

As shown in FIG. 5, the peripheral circuit 300 include an I/O interface 310, a control logic unit 320, a row decoder 330, a voltage generator 340, a page buffer 350, a column decoder 360, a data bus 370 and a register 380. In some examples additional circuits not shown in FIG. 5 may also be included.

The I/O interface 310 may be coupled to the control logic unit 320 and serve as a control buffer to buffer and relay the control commands received from the memory controller 120 (e.g., the memory controller 120 in FIG. 4) to the control logic unit 320, as well as to buffer and relay the status information received from the control logic unit 320 to a host. The I/O interface 310 may be further coupled to the page buffer 350 via the data bus 370 and serve as a data I/O interface 310 and a data buffer to buffer and relay data to the memory array 200 or relay or buffer data from the memory array 200.

The control logic unit 320 may be coupled to the voltage generator 340, the page buffer 350, the column decoder 360, the row decoder 330 and the I/O interface 310 and configured to control operation of the peripheral circuit 300. The control logic unit 320 may control operation of the row decoder 330, the column decoder 360, the page buffer 350 and the voltage generator 340 in response to commands (CMDs) from the memory controller 120 or operation signals generated by control signals. The command may be a program command, a read command and the like.

The row decoder 330 may supply voltages of the word line 250 generated by the voltage generator 340 to the selected word line 250 and unselected word line 250 of the memory array 200 in response to the control by the control logic unit 320. As described below in detail, the row decoder 330 is configured to perform a program operation on the cells of the memory 110 coupled to one or more selected word line 250 in the memory array 200.

The voltage generator 340 may use voltages from an external power source or an internal power source to generate various voltages used for operations on the memory array 200 such as an erase operation, a program operation, a read operation and a verify operation, for example, the program voltage, pass voltage, read voltage and verify voltage and any combination thereof applied to the word line 250.

The column decoder 360 may select one or more memory strings 210 in the memory array 200 by applying voltages of the bit line 240 generated from the voltage generator 340 in response to control from the control logic unit 320.

The page buffer 350 may read and program (write) data from/to the memory array 200 according to control signals from the control logic unit 320. In one example, the page buffer 350 may store program data (write data) to be programmed into memory array 200. In another example, the page buffer 350 may perform a program verify operation to ensure that the data have been properly programmed into the memory cell 212 coupled to the selected word line 250. In still another example, the page buffer 350 may also sense low power signal from the bit line 240, which represent data bits stored in the memory cell 212, and amplify the small voltage swings to recognizable logic levels during the read operation.

The register 380 may be coupled to the control logic unit 320 and include a status register, a command register and an address register for storing the status information, command operation codes (OP codes) and command addresses for controlling operation of each peripheral circuit 300.

It can be understood by those skilled in the art that operations performed by the row decoder 330, the page buffer 350, the control logic unit 320 and the voltage generator 340 as described in the present application can be performed by a processing circuit. Here, the processing circuit may include, but not limited to, hardware such as logic circuits, or any combination of hardware and software such as a processor executing software.

When a read operation is performed by the peripheral circuit 300, state of the memory cell 212 can be identified by applying the read voltage and thus the data is read out. In some implementations, in order to minimize the number of reading errors, the read voltage is generally at a valley between two adjacent threshold voltage distributions. With SLC taken as an example, when the threshold voltage of the memory cell 212 is larger than the read voltage, the memory cell 212 is identified to be in a P state, and the data "0" is read out; when the threshold voltage of the memory cell 212 is not larger than the read voltage, the memory cell 212 is identified to be in the E state, and the data "1" is read out.

Figure 6:
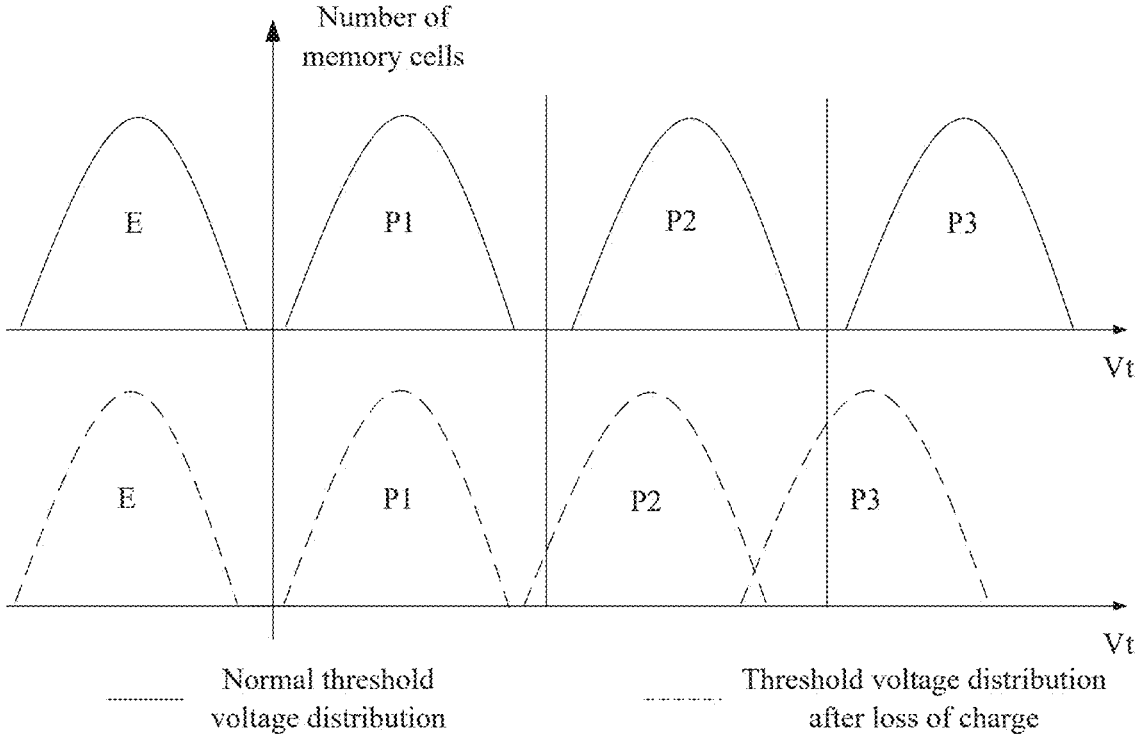
FIG. 6 is a schematic diagram illustrating comparison between a normal threshold voltage distribution and a threshold voltage distribution after loss of charge provided in an example of the present application.

However, as time goes by, loss of charge usually occurs in the memory cell 212, and the higher the threshold voltage of the memory cell 212 is, the higher the loss of charge is. As shown in FIG. 6, the loss of charge will lower the threshold voltage of the memory cell 212, which is expressed as a left shift of threshold voltage on the threshold voltage distribution diagram and a widening of threshold voltage distribution. Because of this, the state of the memory cell 212 cannot be read out correctly using the read voltage, leading to errors in data reading finally.

In some implementations, the read voltage may be adjusted correspondingly through the result of valley detection (e.g., automatic valley detection (AVD)) reading to improve accuracy of the read operation. The AVD reading may be implemented as part of the read operation, or may be implemented through a specialized command from the memory controller to detect the newest threshold voltage distribution of the memory cell 212 as desired.

Figure 7:
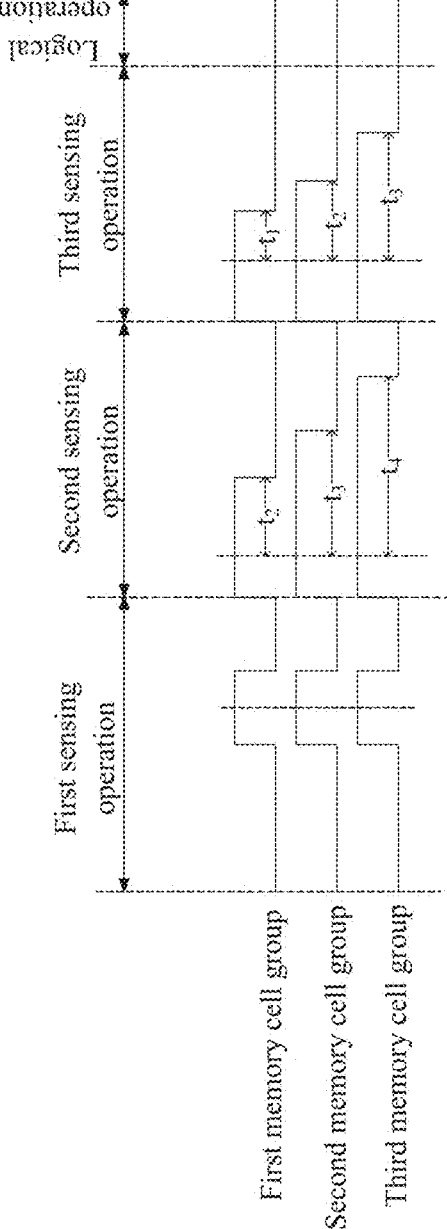
FIG. 7 is a diagram illustrating sensing operations on individual memory cell groups by AVD reading provided in an example of the present application.

In some examples, as shown in FIG. 7, the AVD reading includes one or more reading periods, each of which is configured to identify the valley voltage between two adjacent threshold voltage distribution ranges (e.g., the threshold voltage distribution range of the erase state and the threshold voltage distribution range corresponding to the P1 state). For example, as shown in FIG. 4, for a memory cell using the SLC mode, one reading period may be used to identify the valley voltage between the erase state and the program state; for a memory cell using the MLC mode, reading periods may be used, each of which identifies the valley voltage between two adjacent states, so that the valley voltage between any two adjacent states of multiple states may be further identified.

Referring to FIG. 7 again, each reading period of the AVD reading may include three sensing operations, in which a first sensing operation (also referred to as a coarse sensing) performs sensing on groups of memory cells 212 in parallel with the same sensing development duration. The memory cells 212 may be divided into two groups in the first sensing operation; illustratively, one group of memory cells may be referred to as identified memory cells and the other group of the memory cells may be referred to unidentified memory cells, which can be further identified to be in multiple states.

During a second sensing operation (also referred to as a first fine sensing) and a third sensing operation (also referred to as a second fine sensing), according to the result of the first sensing operation, the sensing operation on the memory cells identified by the first sensing operation is prohibited, so that the number of the memory cells 212, which need to be counted, is reduced, errors and noises of the AVD reading is in turn reduced and accuracy of the AVD reading is guaranteed. In the second and the third sensing operations, groups of memory cells are sensed in parallel with different sensing development durations respectively. For example, the sensing development duration of the second sensing operation on a first memory cell group is $t_2$ and the sensing development duration of the third sensing operation on the first memory cell group is $t_1$. The sensing development duration of the second sensing operation on a second memory cell group is $t_3$ and the sensing development duration of the third sensing operation on the second memory cell group is $t_2$. The sensing development duration of the second sensing operation on a third memory cell group is $t_4$ and the sensing development duration of the third sensing operation on the third memory cell group is $t_3$. A logical operation is performed on the results of the two fine sensing operations to obtain the result of the AVD reading.

In implementations of the present application, the coarse sensing on the memory cells is omitted at each reading period of the AVD reading, e.g., only two sensing operations (e.g., including the first fine sensing and the second fine sensing) are performed at each reading period of the AVD reading in the present application, so that the time needed for the AVD reading is reduced and the speed of the AVD reading is improved. Furthermore, the result of the fine sensing of the first reading period is taken as the result of the coarse sensing of the second reading period. That is, the sensing operation on the memory cells identified at the first reading period is prohibited at the second reading period, so that the speed of the AVD reading is improved while the accuracy of the AVD reading is guaranteed. In some examples, the result of the fine sensing of the second reading period may also be taken as the result of the coarse sensing of the third reading period in implementations of the present application.

Figure 8:
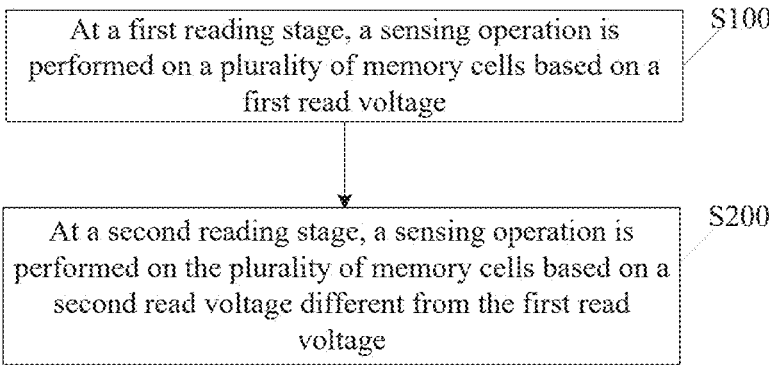
FIG. 8 is a flow chart of a method of operating a memory provided in an example of the present application.

Implementations of the present application provide a method of operating a memory. As shown in FIG. 8, the method includes the following operations S100 to S200.

At operation S100, at a first reading period, a sensing operation is performed on memory cells based on a first read voltage.

In some implementations, the control logic unit 320 performs an automatic valley detection (AVD) read operation on memory cells 212 coupled to the same word line 250 after receiving an AVD instruction. The AVD read operation includes reading periods, the number of the reading periods included in the AVD read operation is related to the type of the memory cells 212.

Figure 9:
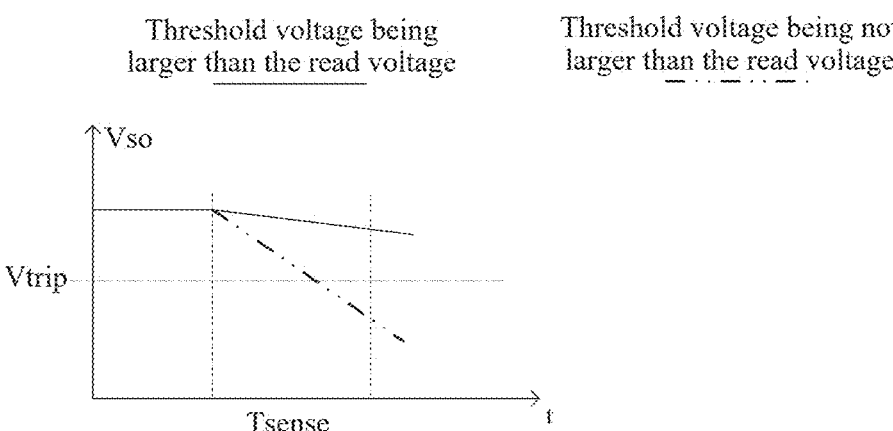
FIG. 9 is a schematic diagram illustrating comparison between speeds of discharging to corresponding sensing node by memory cells with different threshold voltages provided in an example of the present application.

In some implementations, when the sensing operation is performed on the memory cells 212, the control logic unit 320 of the memory 110 controls the voltage generator 340 to charge a sensing node (SO) in page buffers 350 coupled to the memory cells 212 in one-to-one correspondence and to apply a read voltage (e.g., a first read voltage) generated by the voltage generator 340 to the word line 250 coupled to the memory cells 212 through the row decoder 330. The read voltage influences the degrees of turning on of the memory cells 212 and in turn the discharging speeds of the sensing node SO. As shown in FIG. 9, after the sensing development duration Tsense, the data stored in the memory cells 212 are obtained by comparing the voltages $V_{SO}$ of the sensing node and a threshold voltage Vtrip. In some examples, if a threshold voltage Vt is larger than the read voltage, the discharging speed of the sensing node SO is low (in other words, the discharging current is small). After the sensing development duration Tsense, the amount of discharge of the sensing node SO is small (the drop of the voltage $V_{SO}$ of the sensing node is small), so that the voltage $V_{SO}$ of the sensing node is larger than the threshold voltage Vtrip. Likewise, if the threshold voltage Vt is not larger than the read voltage, the discharging speed of the sensing node SO is high (in other words, the discharging current is big). After the sensing development duration Tsense, the amount of discharge of the sensing node SO is large (the voltage $V_{SO}$ of the sensing node drops significantly), so that the voltage $V_{SO}$ of the sensing node is not larger than the threshold voltage Vtrip.

In implementations of the present application, at the first reading period, the sensing development duration for the sensing operation performed on memory cells 212 is not shorter than a first development duration. The read voltage and the sensing development duration Tsense together determine the amount of discharge of the sensing node SO. Therefore, after the first development duration at the first reading period, the memory cells 212, whose threshold voltages are (or are not) larger than a first voltage, may be determined. After a second development duration longer than the first developing duration at the first reading period, the memory cells 212, whose threshold voltages are (or are not) larger than a second voltage, may be determined. The second voltage is larger than the first voltage, so that the memory cells 212 having threshold voltages between the first voltage and the second voltage can be determined by a logical operation.

As shown in FIG. 10, in implementations of the present application, the operation S100 includes the following operations S110 to S140.

At operation S110, at the first sensing period of the first reading period, first data is obtained in the first memory cell group based on the second development duration, second data is obtained in the second memory cell group based on a third development duration, and third data is obtained in the third memory cell group based on a fourth development duration.

In some implementations, the memory cells 212 coupled to the same word line 250 may be divided into memory cell groups. In some examples, the memory cells 212 may be divided into a first memory cell group, a second memory cell group and a third memory cell group. The memory cells 212 may be grouped in many ways, and in some examples, the memory cells in the same memory tile of a memory block may be divided into the same group.

Figure 11:
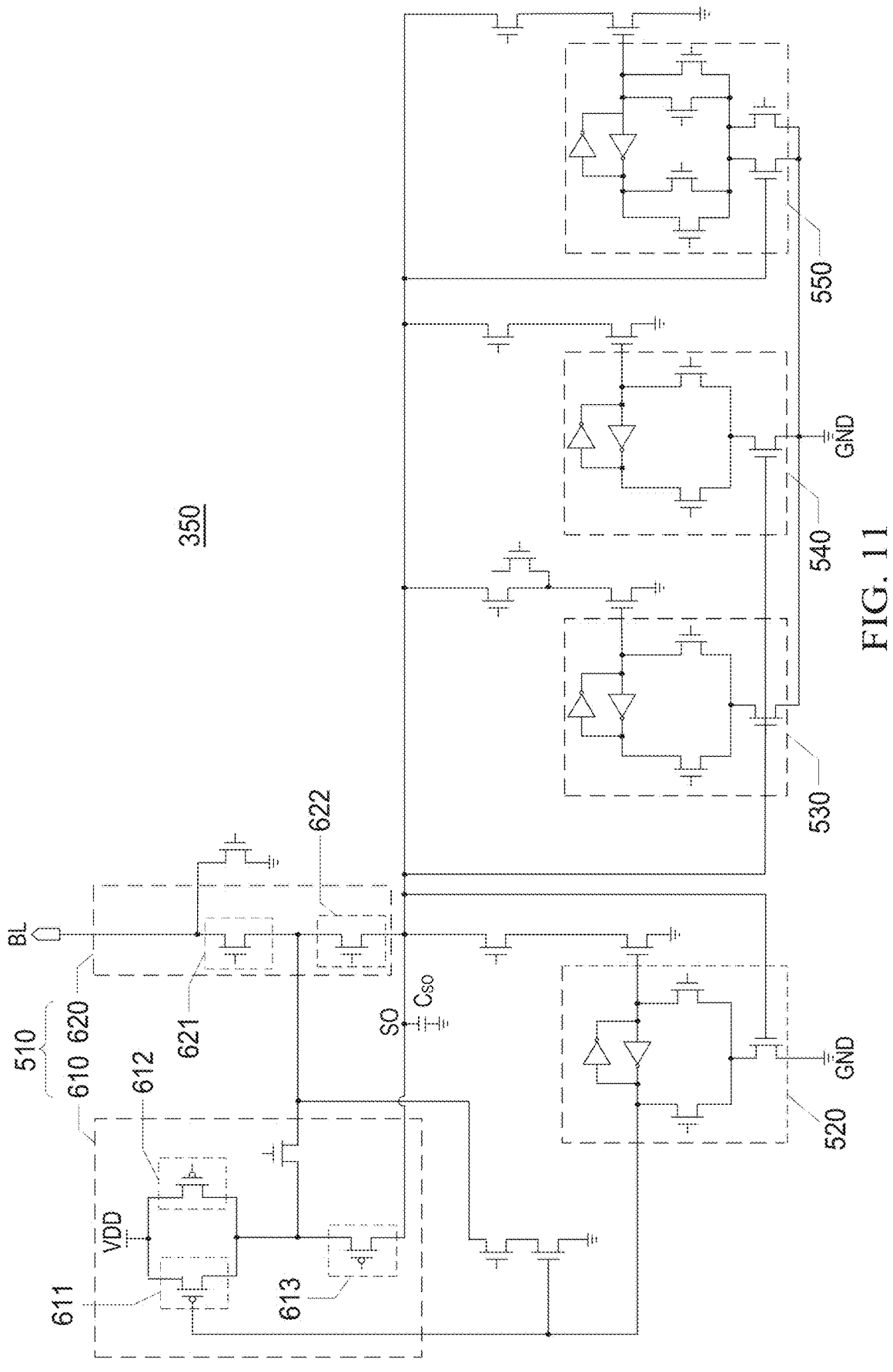
FIG. 11 is a circuit structure diagram of a page buffer provided in an example of the present application.

As shown in FIG. 11, a page buffer 350 includes a sensing node SO, a charging and discharging circuit 510, a first latch circuit 520 (also referred to as a sense latch circuit), a second latch circuit 530 (also referred to as a low voltage threshold latch circuit), at least one third latch circuit 540 (also referred to as a date latch circuit) and a fourth latch circuit 550 (also referred to as a cache latch circuit). In some examples, a capacitor $C_{SO}$ for storing charge is disposed between the sensing node SO and the ground GND or between the sensing node SO and any node of a fixed potential. In some other examples, a parasitic capacitance for storing charge is formed between the sensing node SO and the ground GND or between the sensing node SO and any node of a fixed potential.

The charging and discharging circuit 510 is configured to charge or discharge the capacitor $C_{SO}$ (or the parasitic capacitance) coupled to the sensing node SO. In some examples, the expression of charging (or discharging) the sensing node SO in the present application means charging (or discharging) the capacitor $C_{SO}$ (or the parasitic capacitance) coupled to the sensing node SO. The charging and discharging circuit 510 includes a charging circuit 610 and a discharging circuit 620. The charging circuit 610 has a first terminal configured to output a charging voltage and a second terminal coupled to the sensing node SO. The discharging circuit 620 has a first terminal coupled to the sensing node SO and a second terminal coupled to one terminal of the bit line 240 with the other terminal of the bit line 240 coupled to the memory cell 212. The first latch circuit 520, the second latch circuit 530, the third latch circuit 540 and the fourth latch circuit 550 are all coupled to the sensing node SO.

In some implementations, as shown in FIG. 12, for obtaining the first data in the first memory cell group, the page buffer 350 coupled to the memory cell 212 in the first memory cell group may perform the following operations S111 to S113.

At operation S111, at the first sensing period of the first reading period, the charging and discharging circuit in the page buffer discharges the sensing node after charging the sensing node.

As shown in FIG. 11, in some implementations, the charging circuit 610 includes a first transistor 611, a second transistor 612 and a third transistor 613. The first terminal of the first transistor 611 is coupled to the first terminal of the second transistor 612 as the first terminal of the charging circuit 610; the second terminal of the first transistor 611 and the second terminal of the second transistor 612 are coupled to the first terminal of the third transistor 613, and the second terminal of the third transistor 613 is coupled to the sensing node SO. The discharging circuit 620 includes a fourth transistor 621 and a fifth transistor 622, the first terminal of the fourth transistor 621 is coupled to the bit line 240, the second terminal of the fourth transistor 621 is coupled to the first terminal of the fifth transistor 622, and the second terminal of the fifth transistor 622 is coupled to the sensing node SO.

Figure 13:
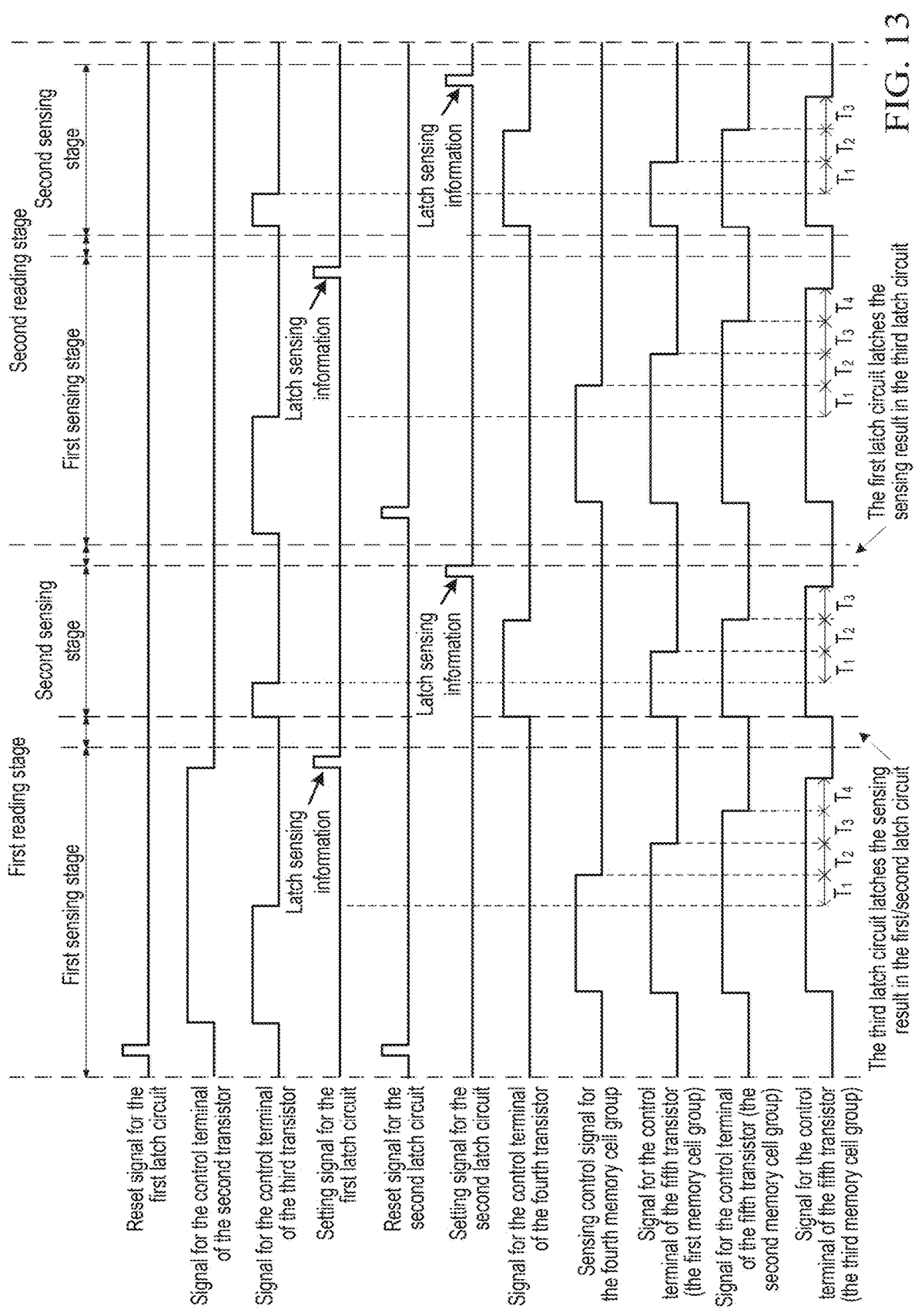
FIG. 13 is a schematic diagram illustrating waveforms of control signals for a page buffer provided in an example of the present application.

As shown in FIG. 13, at the first sensing period of the first reading period, firstly, the second transistor 612 and the third transistor 613 are controlled to turn on by the control terminal signal for the second transistor 612 and the control terminal signal for the third transistor 613 to charge the sensing node SO. Hereafter, the sensing node SO is discharged by turning on the fourth transistor 621 and the fifth transistor 622 and turning off the third transistor 613. In some examples, the timing of turning off the third transistor 613 may be later than the timing of turning on the fourth transistor 621 and the fifth transistor 622. When the fifth transistor 622 is controlled to turn off by the control terminal signal for the fifth transistor 622, discharging of the sensing node SO is stopped. The difference between the timing of turning off the fifth transistor 622 and the timing of turning off the third transistor 613 is the sensing development duration.

At operation S112, after the second development duration, the first latch circuit in the page buffer latches the sensing information according to the voltage of the sensing node.

As shown in FIG. 13, for the page buffer 350 coupled to the memory cell 212 in the first memory cell group, after the second development duration (T1+T2), the fifth transistor 622 in the page buffer 350 is turned off to stop discharging of the sensing node SO. After the discharging circuit 620 stops discharging of the sensing node SO, the first latch circuit 520 may latch sensing information according to the voltage $V_{SO}$ of the sensing node.

In some examples, the threshold voltage of the memory cell 212 is larger than the read voltage (the discharging speed of the sensing node SO is low), the drop of the voltage $V_{SO}$ of the sensing node is small or even no drop occurs to the voltage $V_{SO}$ of the sensing node after the discharging circuit 620 stops discharging of the sensing node SO, and the voltage $V_{SO}$ of the sensing node remains a high level. In some other examples, the threshold voltage of the memory cell 212 is not larger than the read voltage (the discharging speed of the sensing node SO is high), the voltage $V_{SO}$ of the sensing node drops significantly or even the voltage $V_{SO}$ of the sensing node drops to the ground voltage after the discharging circuit 620 stops discharging of the sensing node SO, and the voltage $V_{SO}$ of the sensing node drops to a low level. The first latch circuit 520 latches different sensing information according to the voltage $V_{SO}$ of the sensing node; illustratively, when the voltage $V_{SO}$ of the sensing node is at a high level (e.g., the threshold voltage of the memory cell 212 is larger than the read voltage), the sensing information latched by the first latch circuit 520 is a first sensing information. When the voltage $V_{SO}$ of the sensing node is at a low level (e.g., the threshold voltage of the memory cell 212 is not larger than the read voltage), the sensing information latched by the first latch circuit 520 is a second sensing information.

At operation S113, the page buffer obtains first data according to the sensing information latched by the first latch circuit.

As described above, the read voltage influences the discharging speed of the sensing node SO. At the same read voltage, the discharging speed of the sensing node SO remains the same, so that the longer the sensing development duration is, the higher the amount of charge released through the sensing node SO is. Likewise, the higher the read voltage is, the higher the discharging speed of the sensing node SO is, and the higher the amount of charge released through the sensing node SO is with the same development duration. That is, at the same read voltage (e.g., the first read voltage), the difference between the first development duration and the second development duration may be equivalent to the difference between read voltages with the same sensing development duration. At the same first read voltage, the relationship between the threshold voltage of the memory cell 212 and the first voltage can be determined with the relatively short first development duration; the relationship between the threshold voltage of the memory cell 212 and the second voltage can be determined with the relatively long second development duration, where the second voltage is larger than the first voltage.

In some implementations, the first data indicates the number of the memory cells 212 having threshold voltages larger than the second voltage in the first memory cell group, e.g., the number of page buffers 350, in which the first latch circuit 520 latches the first sensing information, among the page buffers 350 coupled to the memory cells 212 in the first memory cell group. In some other implementations, the first data indicates the number of the memory cells 212 having threshold voltages not larger than the second voltage in the first memory cell group, e.g., the number of page buffers

350, in which the first latch circuit 520 latch the second sensing information, among the page buffers 350 coupled to the memory cells 212 in the first memory cell group.

Likewise, the memory 110 includes the page buffer 350 coupled to the memory cells 212 in the second memory cell group and the page buffer 350 coupled to the memory cells 212 in the third memory cell group.

In some implementations, the second data indicates the number of the memory cells 212 having threshold voltages larger (or not larger) than a third voltage in the second memory cell group. For obtaining the second data in the second memory cell group, the page buffer 350 coupled to the memory cells 212 in the second memory cell group may perform operations S114 to S116. Here, operation S114 is the same as operation S111, operation S116 is the same as operation S113, and operation S115 differs from operation S112 in that, in operation S125, the first latch circuit 520 latches sensing information according to the voltage $V_{SO}$ of the sensing node after the third development duration (T1+T2+T3).

In some implementations, the third data indicates the number of the memory cells 212 having threshold voltages larger (or not larger) than a fourth voltage in the third memory cell group. For obtaining the third data in the third memory cell group, the page buffer 350 coupled to the memory cells 212 in the third memory cell group may perform operations S117 to S119. Here, operation S117 is the same as operation S111, operation S119 is the same as operation S113, and operation S118 differs from operation S112 in that, in operation S118, the first latch circuit 520 latches sensing information according to the voltage $V_{SO}$ of the sensing node after a fourth development duration (T1+T2+T3+T4).

At operation S120, at the second sensing period of the first reading period, fourth data is obtained in the first memory cell group based on the first development duration, fifth data is obtained in the second memory cell group based on the second development duration, and sixth data is obtained in the third memory cell group based on the third development duration.

In some implementations, the fourth data indicates the number of the memory cells 212 having threshold voltages larger (or not larger) than the first voltage in the first memory cell group. For obtaining the fourth data in the first memory cell group, the page buffer 350 coupled to the memory cells 212 in the second memory cell group may perform operations S121 to S123. Here, operation S121 is the same as operation S111, operation S123 is the same as operation S113, and operation S122 differs from operation S112 in that, in operation S122, the second latch circuit 530 latches sensing information according to the voltage $V_{SO}$ of the sensing node after the first development duration (T1). As shown in FIG. 13, that is, at the second sensing period of the first reading period, it is the second latch circuit 530 that latches the sensing information after discharging the sensing node SO.

In some implementations, the fifth data indicates the number of the memory cells 212 having threshold voltages larger (or not larger) than the second voltage in the second memory cell group. For obtaining the fifth data in the second memory cell group, the page buffer 350 coupled to the memory cells 212 in the second memory cell group may perform operations S124 to S126. Here, operation S124 is the same as operation S111, operation S126 is the same as operation S113, and operation S125 differs from operation S112 in that, in operation S125, the second latch circuit 530 latches sensing information according to the voltage $V_{SO}$ of the sensing node after the second development duration.

In some implementations, the sixth data indicates the number of the memory cells 212 having threshold voltages larger (or not larger) than the third voltage in the third memory cell group. For obtaining the fourth data in the third memory cell group, the page buffer 350 coupled to the memory cells 212 in the second memory cell group may perform operations S127 to S129. Here, operation S127 is the same as operation S111, operation S129 is the same as operation S113, and operation S128 differs from operation S112 in that, in operation S128, the second latch circuit 530 latches sensing information according to the voltage $V_{SO}$ of the sensing node after the first development duration.

At operation S130, based on the first data and the fourth data, the number of the first memory cell is determined in the first memory cell group; based on the second data and the fifth data, the number of the second memory cell is determined in the second memory cell group; and based on the third data and the sixth data, the number of the third memory cell is determined in the third memory cell group.

Figure 14:
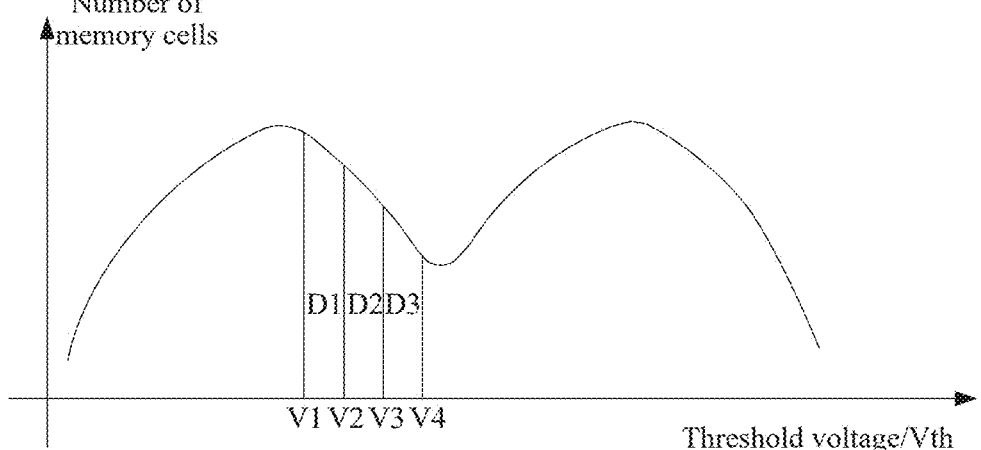
FIG. 14 is a schematic diagram of a first determination result of a valley voltage provided in an example of the present application.

As shown in FIG. 14, the first data indicates the number of the memory cells 212 having threshold voltages larger (or not larger) than the second voltage in the first memory cell group, and the fourth data indicates the number of the memory cells 212 having threshold voltages larger (or not larger) than the first voltage in the first memory cell group. A logical operation is performed on the first data and the fourth data to determine the number of first memory cell having threshold voltages between the first voltage V1 and the second voltage V2 in the first memory cell group. The number of the first memory cell may be designated as D1.

The second data indicates the number of the memory cells 212 having threshold voltages larger (or not larger) than the third voltage in the second memory cell group, and the fourth data indicates the number of the memory cells 212 having threshold voltages larger (or not larger) than the second voltage in the second memory cell group. A logical operation is performed on the second data and the fourth data to determine the number of second memory cell having threshold voltages between the second voltage V2 and the third voltage V3 in the second memory cell group. The number of the second memory cell may be designated as D2.

The third data indicates the number of the memory cells 212 having threshold voltages larger (or not larger) than the fourth voltage in the third memory cell group, and the fifth data indicates the number of the memory cells 212 having threshold voltages larger (or not larger) than the third voltage in the third memory cell group. A logical operation is performed on the third data and the fifth data to determine the number of third memory cell having threshold voltages between the third voltage V3 and the fourth voltage V4 in the third memory cell group. The number of the third memory cell may be designated as D3.

At operation S140, based on the number of the first memory cell, the number of the second memory cell and the number of the third memory cell, the valley voltage between the first threshold voltage distribution range and the second threshold voltage distribution range being adjacent to the first threshold voltage distribution range is determined.

In some implementations, at least one of the first voltage, the second voltage, the third voltage and the fourth voltage is within the first threshold voltage distribution range or the second threshold voltage distribution range.

As shown in FIG. 14, in some examples, when the number of the first memory cell is larger than the number of the second memory cell and the number of the second memory cell is larger than the number of the third memory cell (e.g., D1>D2>D3), the valley voltage may be equal to or larger than the fourth voltage. In this case, one or more voltage ranges larger than the fourth voltage may be used to further determine the valley voltage.

Figure 15:
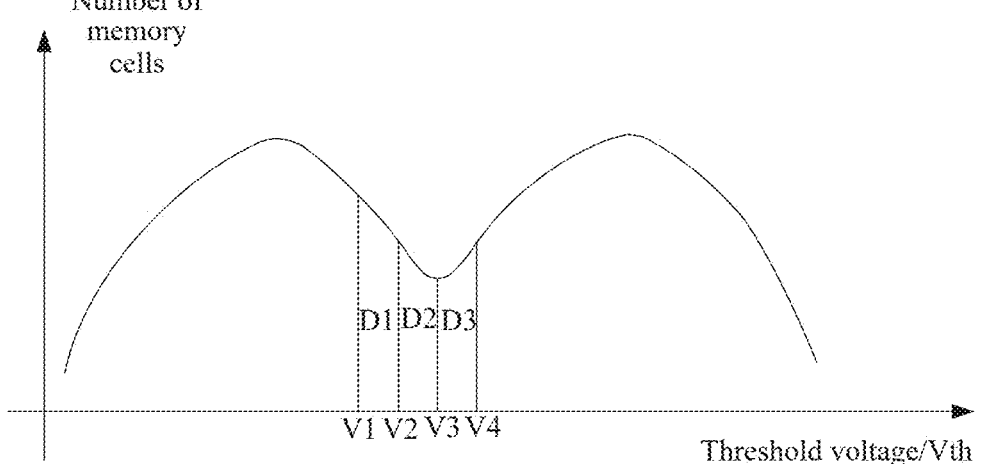
FIG. 15 is a schematic diagram of a second determination result of a valley voltage provided in an example of the present application.

As shown in FIG. 15, in some examples, when the number of the first memory cell is larger than the number of the second memory cell and the number of the second memory cell is equal to the number of the third memory cell (e.g., D1>D2=D3), the valley voltage may be equal to the third voltage. It can be understood that if the difference between the number of the second memory cell and the number of the third memory cell is not larger than 1% of the smaller one of the number of the second memory cell and the number of the third memory cell, the number of the second memory cell can still be considered to be the same as the number of the third memory cell.

Figure 16:
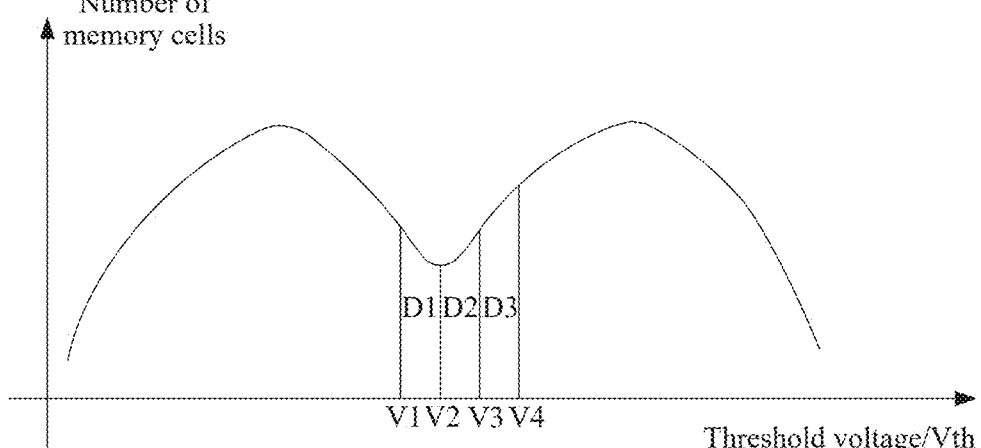
FIG. 16 is a schematic diagram of a third determination result of a valley voltage provided in an example of the present application.

As shown in FIG. 16, in some examples, when the number of the first memory cell is the same as the number of the second memory cell, and the number of the second memory cell is not larger than the number of the third memory cell (e.g., D1=D2<D3), the valley voltage may be equal to the second voltage. It can be understood that if the difference between the number of the first memory cell and the number of the second memory cell is not larger than 1% of the smaller one of the number of the first memory cell and the number of the second memory cell, the number of the first memory cell can still be considered to be the same as the number of the second memory cell.

Figure 17:
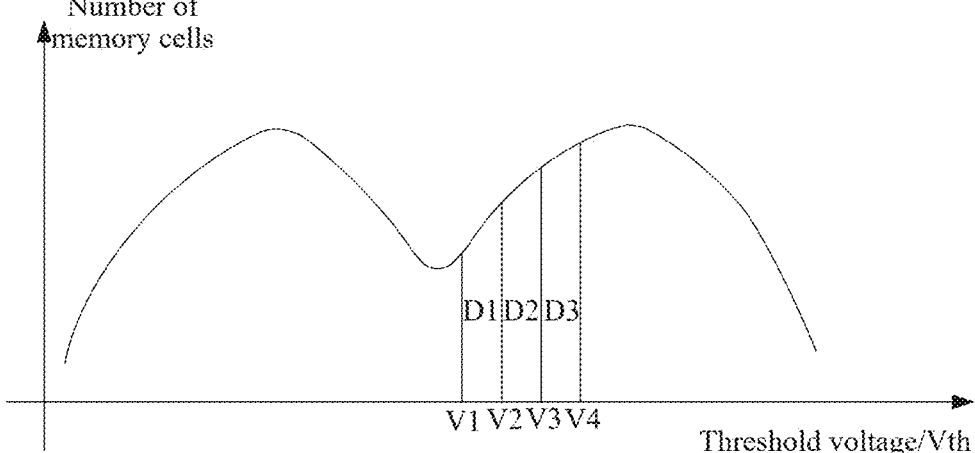
FIG. 17 is a schematic diagram of a fourth determination result of a valley voltage provided in an example of the present application.

As shown in FIG. 17, in some examples, when the number of the first memory cell is not larger than the number of the second memory cell and the number of the second memory cell is not larger than the number of the third memory cell (e.g., D1<D2<D3), the valley voltage may be equal to or not larger than the first voltage. In this case, one or more voltage ranges not larger than the first voltage may be used to further determine the valley voltage.

At operation S200, at the second reading period, a sensing operation is performed on memory cells based on a second read voltage different from the first read voltage.

In some implementations, at the second reading period, the sensing development duration for the sensing operation performed on the memory cells 212 is not shorter than a fifth development duration. Here, at the first sensing period of the second reading period, seventh data is obtained in the first memory cell group based on a sixth development duration, eighth data is obtained in the second memory cell group based on a seventh development duration, and ninth data is obtained in the third memory cell group based on an eighth development duration. At the second sensing period of the second reading period, tenth data is obtained in the first memory cell group based on the fifth development duration, eleventh data is obtained in the second memory cell group based on the sixth development duration, and twelfth data is obtained in the third memory cell group based on the seventh development duration. Based on the seventh data and the tenth data, the number of the fourth memory cell is determined in the first memory cell group, with the threshold voltage of the fourth memory cell being between a fifth voltage and a sixth voltage. Based on the eighth data and the eleventh data, the number of the fifth memory cell is determined in the second memory cell group, with the threshold voltage of the fifth memory cell being between the sixth voltage and a seventh voltage. Based on the ninth data and the twelfth data, the number of the sixth memory cell is determined in the third memory cell group, with the threshold voltage of the sixth memory cell being between the seventh voltage and a eighth voltage. Based on the number of the fourth memory cell, the number of the fifth memory cell and the number of the sixth memory cell, the valley voltage between the third threshold voltage distribution range and the fourth threshold voltage distribution range being adjacent to the third threshold voltage distribution range is determined. At least one of the fifth voltage, the sixth voltage, the seventh voltage and the eighth voltage is within the third threshold voltage distribution range or the fourth threshold voltage distribution range.

In some examples, the first development duration may be the same as the fifth development duration. In some other examples, the first development duration may be different from the fifth development duration. Likewise, the second development duration may be the same as or different from the sixth development duration; the third development duration may be the same as or different from the seventh development duration; and the fourth development duration may be the same as or different from the eighth development duration.

Figure 18:
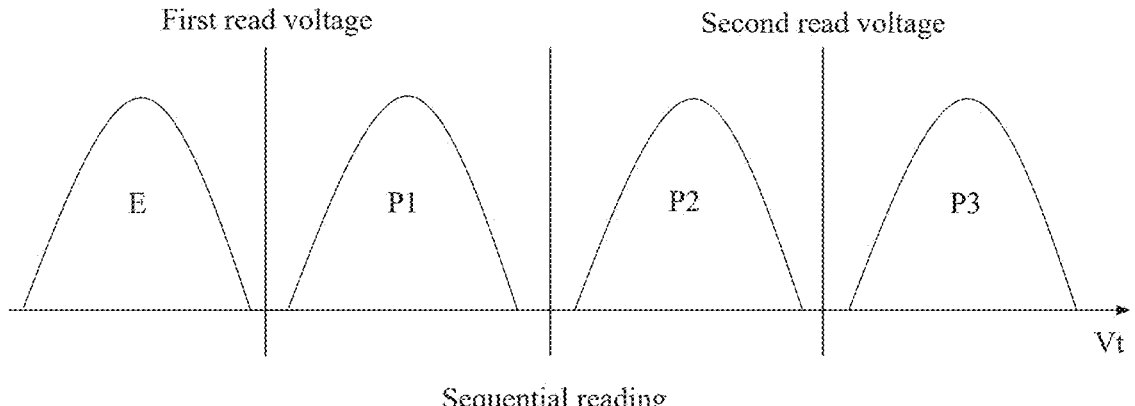
FIG. 18 is a schematic diagram illustrating the threshold voltage identification of memory cells when reading sequentially provided in an example of the present application.

In some implementations, the first read voltage is smaller than the second read voltage, and the AVD reading may use a sequential reading manner. As shown in FIG. 18, in some examples, based on the first read voltage, the memory cells 212 in the erase state may be identified at the first reading period. Based on the second read voltage, the memory cells 212 in the P3 state may be identified at the second reading period. Illustratively, at the first sensing period of the first reading period, the memory cells 212 having threshold voltages not larger than the second voltage may be identified in the first memory cell group; at the first sensing period of the first reading period, the memory cells 212 having threshold voltages not larger than the first voltage may be identified in the first memory cell group.

Figure 19:
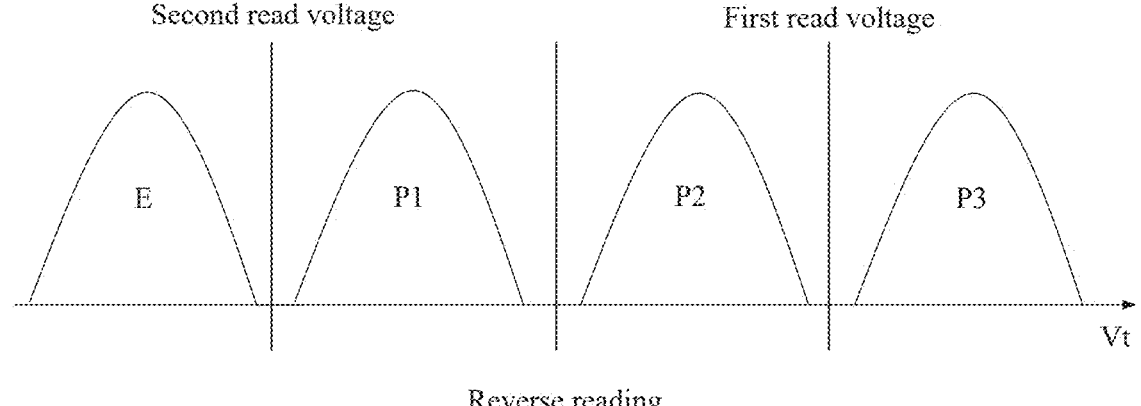
FIG. 19 is a schematic diagram illustrating the threshold voltage identification of memory cells when reading reversely provided in an example of the present application.

In some other implementations, the first read voltage is larger than the second read voltage, and the AVD reading may use a reverse reading manner. As shown in FIG. 19, in some examples, based on the first read voltage, the memory cells 212 in the P3 state may be identified at the first reading period. Based on the second read voltage, the memory cells 212 in the erase state may be identified at the second reading period. Illustratively, at the first sensing period of the first reading period, the memory cells 212 having threshold voltages larger than the second voltage may be identified in the first memory cell group; at the first sensing period of the first reading period, the memory cells 212 having threshold voltages larger than the first voltage may be identified in the first memory cell group.

Figure 20:
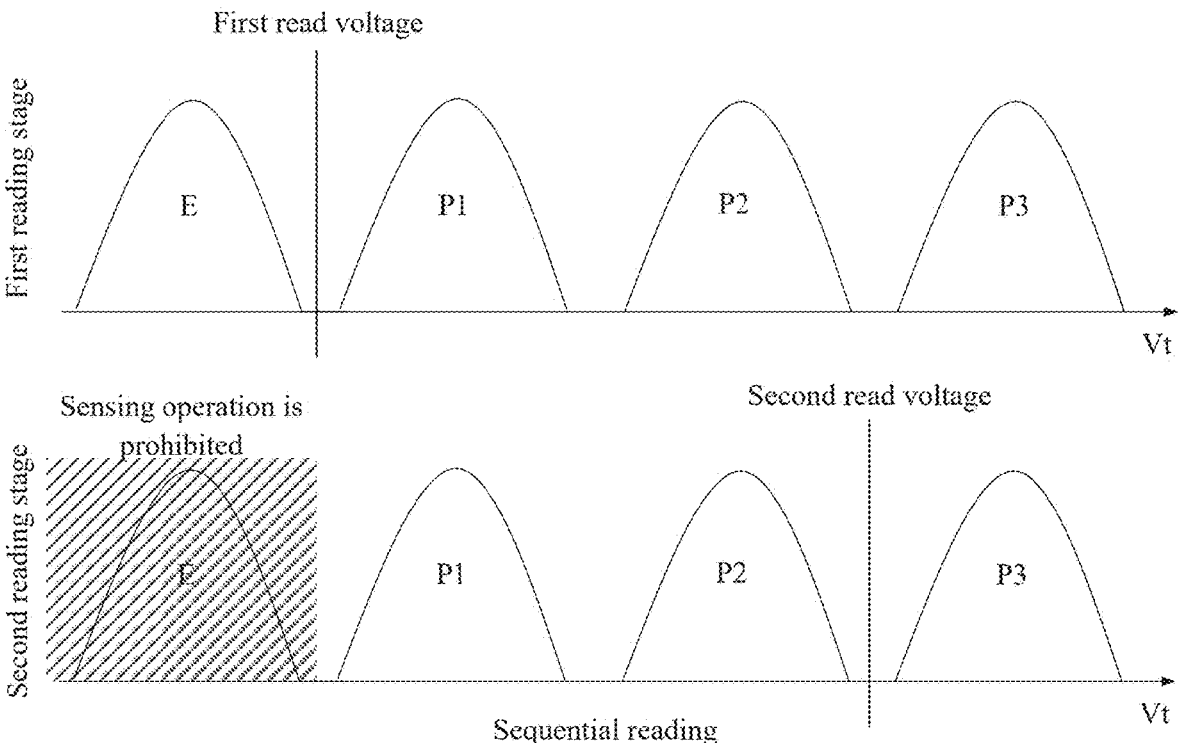
FIG. 20 is a schematic diagram illustrating sensing operations being prohibited by the threshold voltage identification of memory cells when reading sequentially provided in an example of the present application.

As shown in FIG. 20, when the AVD reading uses a sequential reading manner, by prohibiting, at the second reading period, the sensing operation on the memory cells 212 identified at the first reading period, the number of the memory cells 212 to be counted at the second reading period is reduced and errors and noises occurred at the second reading period are reduced. At the second reading period, the following operations S210 to S230 may be further performed.

At operation S210, at the second reading period, the sensing operation on the memory cells 212 having threshold voltages not larger than the second voltage in the first memory cell group is prohibited; or the sensing operation on the memory cells 212 having threshold voltages not larger than the first voltage in the first memory cell group is prohibited.

As described above, in the page buffer 350 coupled to the memory cells 212 of the first memory cell group, the sensing information latched by the first latch circuit 520 at the first sensing period of the first reading period may indicate whether the threshold voltage of the memory cell 212 in the first memory cell group is larger than the second voltage. The sensing information latched by the second latch circuit 530 at the second sensing period of the first reading period may indicate whether the threshold voltage of the memory cell 212 in the first memory cell group is larger than the first voltage. In some examples, a first sensing information latched by the first latch circuit 520 indicates the threshold voltage of the memory cell 212 is larger than the second voltage and a second sensing information latched by the first latch circuit 520 indicates the threshold voltage of the memory cell 212 is not larger than the second voltage. A first sensing information latched by the second latch circuit 530 indicates the threshold voltage of the memory cell 212 is larger than the first voltage and a second sensing information latched by the second latch circuit 530 indicates the threshold voltage of the memory cell 212 is not larger than the first voltage.

In some implementations, the first latch circuit 520 may control the charging circuit 610 to prohibit charging of the sensing node SO at the second reading period according to the second sensing information latched at the first sensing period of the first reading period. As a result, at the second period, the sensing operation on the memory cells 212 having threshold voltages not larger than the second voltage in the first memory cell group is prohibited.

At the first reading period, it is needed to perform a logical operation based on the sensing information latched by the first latch circuit 520 and the sensing information latched by the second latch circuit 530 to determine the number of the first memory cell in the first memory cell group. As a result, the logical operation may cause loss of the sensing information latched by the latch circuit. Therefore, in some implementations, after the first sensing period of the first reading period, the control logic unit 320 copies the sensing information latched by the first latch circuit 520 (e.g., the sensing information at the first sensing period of the first reading period) into a third latch circuit 540. After the logical operation, and before the second reading period, the control logic unit 320 transfers the sensing information latched by the third latch circuit 540 back to the first latch circuit 520. Thereby, at the second reading period, based on the fact that the latched sensing information is the second sensing information, the first latch circuit 520 controls the charging circuit 610 to prohibit the charging of the sensing node SO, so that the sensing operation on the memory cells 212 having threshold voltages not larger than the second voltage in the first memory cell group is prohibited. Then the number of the memory cells 212 needed to be counted is reduced and errors and noises occurred at the second reading period are reduced.

In some other implementations, the first latch circuit 520 may control the charging circuit 610 to prohibit the charging of the sensing node SO at the second reading period according to the second sensing information latched at the second sensing period of the first reading period. As a result, at the second period, the sensing operation on the memory cells 212 having threshold voltages not larger than the first voltage in the first memory cell group is prohibited.

Likewise, at the first reading period, it is needed to perform a logical operation based on the sensing information latched by the first latch circuit 520 and the sensing information latched by the second latch circuit 530 determine the number of the first memory cell in the first memory cell group. As a result, the logical operation may cause loss of the sensing information latched by the latch circuit. Therefore, in some implementations, after the second sensing period of the first reading period, the control logic unit 320 copies the sensing information latched by a second latch circuit 530 (e.g., the sensing information at the second sensing period of the first reading period) into a third latch circuit 540. After the logical operation, and before the second reading period, the control logic unit 320 transfers the sensing information latched by the third latch circuit 540 again to the first latch circuit 520. Thereby, at the second reading period, based on the fact that the latched sensing information is the second sensing information, the first latch circuit 520 controls the charging circuit 610 to prohibit the charging of the sensing node SO, so that the sensing operation on the memory cells 212 having threshold voltages not larger than the first voltage in the first memory cell group is prohibited. Then, the number of the memory cells 212 to be counted is reduced and errors and noises occurred at the second reading period are reduced.

At operation S220, at the second reading period, the sensing operation on the memory cells 212 having threshold voltages not larger than the third voltage in the second memory cell group is prohibited; or the sensing operation on the memory cells 212 having threshold voltages not larger than the second voltage in the second memory cell group is prohibited.

As described above, in the page buffer 350 coupled to the memory cells 212 of the second memory cell group, the sensing information latched by the first latch circuit 520 at the first sensing period of the first reading period may indicate whether the threshold voltage of the memory cell 212 in the second memory cell group is larger than the third voltage. The sensing information latched by the second latch circuit 530 at the second sensing period of the first reading period may indicate whether the threshold voltage of the memory cell 212 in the second memory cell group is larger than the second voltage. In some examples, the first sensing information latched by the first latch circuit 520 indicates the threshold voltage of the memory cell 212 is larger than the third voltage and the second sensing information latched by the first latch circuit 520 indicates the threshold voltage of the memory cell 212 is not larger than the third voltage. The first sensing information latched by the second latch circuit 530 indicates the threshold voltage of the memory cell 212 is larger than the second voltage and the second sensing information latched by the second latch circuit 530 indicates the threshold voltage of the memory cell 212 is not larger than the second voltage.

In some implementations, after the first sensing period of the first reading period, the control logic unit 320 copies the sensing information latched by the first latch circuit 520 (e.g., the sensing information at the first sensing period of the first reading period) into a third latch circuit 540. After the logical operation, and before the second reading period, the control logic unit 320 transfers the sensing information latched by the third latch circuit 540 again to the first latch circuit 520. Thereby, at the second reading period, based on the fact that the latched sensing information is the second sensing information, the first latch circuit 520 controls the charging circuit 610 to prohibit the charging of the sensing node SO, so that the sensing operation on the memory cells 212 having threshold voltages not larger than the third voltage in the second memory cell group is prohibited. Then the number of the memory cells 212 to be counted is reduced and errors and noises occurred at the second reading period are reduced.

In some other implementations, after the second sensing period of the first reading period, the control logic unit 320 copies the sensing information latched by the second latch circuit 530 (e.g., the sensing information at the second sensing period of the first reading period) into the third latch circuit 540. After the logical operation, and before the second reading period, the control logic unit 320 transfers the sensing information latched by the third latch circuit 540 again to the first latch circuit 520. Thereby, at the second reading period, based on the fact that the latched sensing information is the second sensing information, the first latch circuit 520 controls the charging circuit 610 to prohibit the charging of the sensing node SO, so that the sensing operation on the memory cells 212 having threshold voltages not larger than the first voltage in the first memory cell group is prohibited. Then the number of the memory cells 212 to be counted is reduced and errors and noises occurred at the second reading period are reduced.

At operation S230, at the second reading period, the sensing operation on the memory cells 212 having threshold voltages not larger than the fourth voltage in the third memory cell group is prohibited; or the sensing operation on the memory cells 212 having threshold voltages not larger than the third voltage in the third memory cell group is prohibited.

As described above, in the page buffer 350 coupled to the memory cells 212 of the third memory cell group, the sensing information latched by the first latch circuit 520 at the first sensing period of the first reading period may indicate whether the threshold voltage of the memory cell 212 in the third memory cell group is larger than the fourth voltage. The sensing information latched by the second latch circuit 530 at the second sensing period of the first reading period may indicate whether the threshold voltage of the memory cell 212 in the third memory cell group is larger than the third voltage. In some examples, the first sensing information latched by the first latch circuit 520 indicates the threshold voltage of the memory cell 212 is larger than the fourth voltage and the second sensing information latched by the first latch circuit 520 indicates the threshold voltage of the memory cell 212 is not larger than the fourth voltage. The first sensing information latched by the second latch circuit 530 indicates the threshold voltage of the memory cell 212 is larger than the third voltage and the second sensing information latched by the second latch circuit 530 indicates the threshold voltage of the memory cell 212 is not larger than the third voltage.

In some implementations, after the first sensing period of the first reading period, the control logic unit 320 copies the sensing information latched by the first latch circuit 520 (e.g., the sensing information at the first sensing period of the first reading period) into the third latch circuit 540. After the logical operation, and before the second reading period, the control logic unit 320 transfers the sensing information latched by the third latch circuit 540 again to the first latch circuit 520. Thereby, at the second reading period, based on the fact that the latched sensing information is the second sensing information, the first latch circuit 520 controls the charging circuit 610 to prohibit the charging of the sensing node SO, so that the sensing operation on the memory cells 212 having threshold voltages not larger than the fourth voltage in the third memory cell group is prohibited. Then the number of the memory cells 212 to be counted is reduced and errors and noises occurred at the second reading period are reduced.

In some other implementations, after the second sensing period of the first reading period, the control logic unit 320 copies the sensing information latched by the second latch circuit 530 (e.g., the sensing information at the second sensing period of the first reading period) into the third latch circuit 540. After the logical operation, and before the second reading period, the control logic unit 320 transfers the sensing information latched by the third latch circuit 540 again to the first latch circuit 520. Thereby, at the second reading period, based on the fact that the latched sensing information is the second sensing information, the first latch circuit 520 controls the charging circuit 610 to prohibit the charging of the sensing node SO, so that the sensing operation on the memory cells 212 having threshold voltages not larger than the third voltage in the third memory cell group is prohibited. Then the number of the memory cells 212 to be counted is reduced and errors and noises occurred at the second reading period are reduced.

Figure 21:
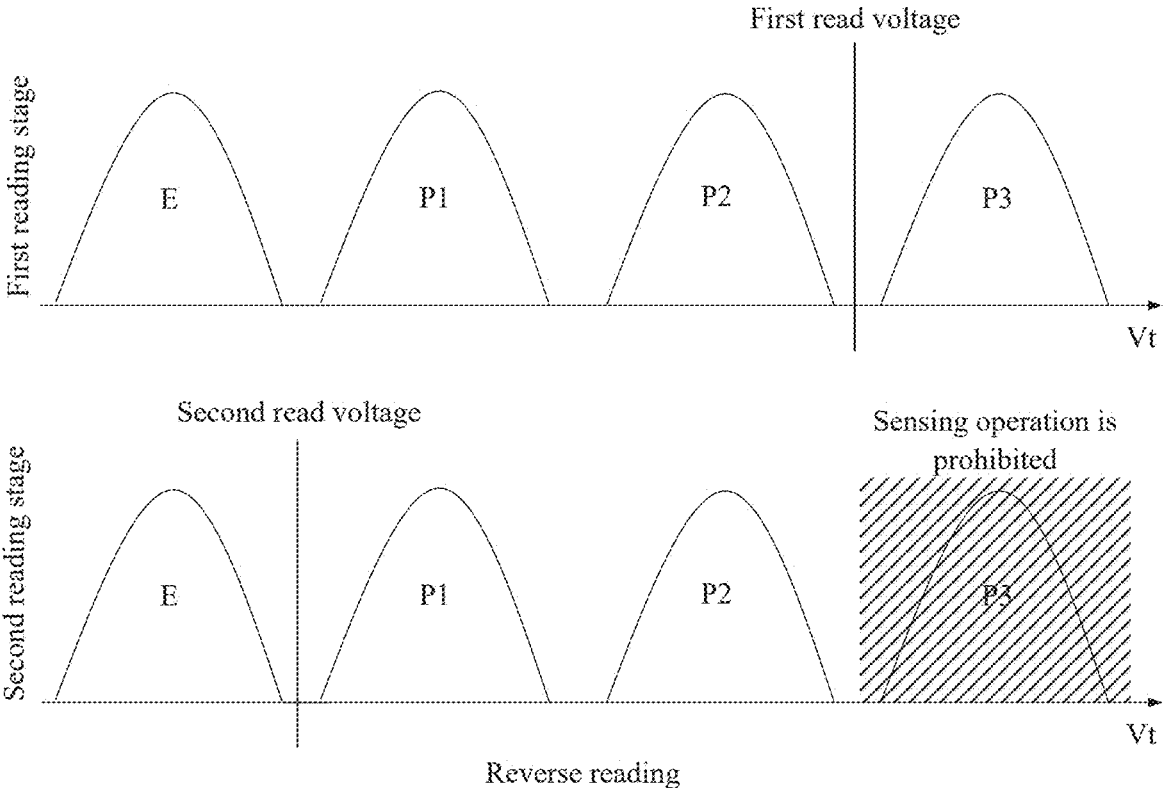
FIG. 21 is a schematic diagram illustrating sensing operations being prohibited by the threshold voltage identification of memory cells when reading reversely provided in an example of the present application.

As shown in FIG. 21, when the AVD reading uses a reverse reading manner, by prohibiting, at the second reading period, the sensing operation on the memory cells 212 identified at the first reading period, the number of the memory cells 212 needed to be counted at the second reading period is reduced and errors and noises occurred at the second reading period are reduced. At the second reading period, the following operations S240 to S260 are performed.

At operation S240, at the second reading period, the sensing operation on the memory cells 212 having threshold voltages larger than the second voltage in the first memory cell group is prohibited; or the sensing operation on the memory cells 212 having threshold voltages larger than the first voltage in the first memory cell group is prohibited.

The difference from the operation S210 is that at the second reading period, in the page buffer 350 coupled to the memory cells 212 in the first memory cell group, the first latch circuit 520, based on the fact that the latched sensing information is the first sensing information, controls the charging circuits 610 to prohibit the charging of the sensing node SO, so that the sensing operation on the memory cells 212 having threshold voltages larger than the second voltage (or the first voltage) in the first memory cell group is prohibited. Then the number of the memory cells 212 to be counted is reduced and errors and noises occurred at the second reading period are reduced.

At operation S250, at the second reading period, the sensing operation on the memory cells 212 having threshold voltages larger than the third voltage in the second memory cell group is prohibited; or the sensing operation on the memory cells 212 having threshold voltages larger than the second voltage in the second memory cell group is prohibited.

The difference from operation S220 is that at the second reading period, in the page buffer 350 coupled to the memory cells 212 in the second memory cell group, the first latch circuit 520, based on the fact that the latched sensing information is the first sensing information, controls the charging circuit 610 to prohibit the charging of the sensing node SO, so that the sensing operation on the memory cells 212 having threshold voltages larger than the third voltage (or the second voltage) in the first memory cell group is prohibited. Then the number of the memory cells 212 to be counted is reduced and errors and noises occurred at the second reading period are reduced.

At operation S260, at the second reading period, the sensing operation on the memory cells 212 having threshold voltages larger than the fourth voltage in the third memory cell group is prohibited; or the sensing operation on the memory cells 212 having threshold voltages larger than the third voltage in the third memory cell group is prohibited.

The difference from operation S230 is that at the second reading period, in the page buffer 350 coupled to the memory cells 212 in the third memory cell group, the first latch circuit 520, based on the fact that the latched sensing information is the first sensing information, controls the charging circuit 610 to prohibit the charging of the sensing node SO, so that the sensing operation on the memory cells 212 having threshold voltages larger than the fourth voltage (or the third voltage) in the third memory cell group is prohibited. Then the number of the memory cells 212 to be counted is reduced and errors and noises occurred at the second reading period are reduced.

Figure 22:
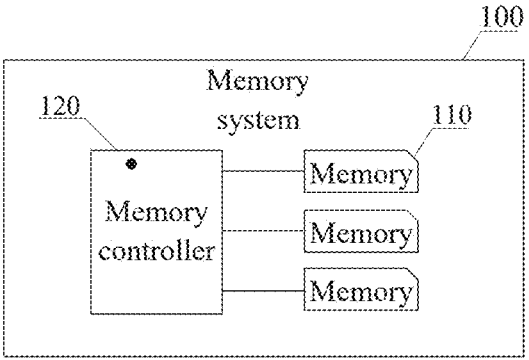
FIG. 22 is a structural diagram of a memory system provided in an example of the present application.

As shown in FIG. 22, implementations of the present application provide a memory system 100 including a memory controller 120 and a memory 110 as shown in FIG. 1. The memory controller 120 is coupled to the memory 110. In some implementations, the memory controller 120 may send an automatic valley detection (AVD) instruction to the memory 110 and the memory 110 may perform the method shown in the above-described operations S100-S200 in response to the received AVD instruction. In some other implementations, the memory controller 120 may also send various commands (a program command, a read command, and an erase command etc.) to the memory 110 based on instructions received from a host, to control operations (e.g., a program operation, a read operation, and an erase operation etc.) of the memory 110.

In some examples, the memory controller 120 may also be configured to manage various functions, with respect to the data stored or to be stored in the memory device, including but not limit to bad-block management, garbage collection, logical-to-physical address conversion and wear leveling, etc. Of course, the memory controller 120 may also perform any other suitable functions (e.g., formatting the memory 110), description will not be repeated here.

In some implementations, the memory controller 120 and one or more memories 110 may be packaged into different types of electronic products. In some examples, the memory controller 120 and a single memory 110 may be integrated into a memory card. The memory card may include a personal computer memory card (PCMCIA card), a compact flash (CF) card, a smart media (SM) card, a memory stick, a multi-media card (MMC), a secure digital (SD) card or the like. The memory card may further include a memory card connector coupling the memory card with a host. In some other examples, the memory controller 120 and memories 110 may be integrated into a solid state disk (SSD). The SSD may further include an SSD connector coupling the SSD to the host. In some implementations, the memory capacity and/or operating speed of the SSD are greater than the memory capacity and/or operating speed of the memory card.

The memory controller 120 may communicate with an external device (e.g., a host) via at least one of various interface protocols. The interface protocols include at least one of a universal serial bus (USB) protocol, a multi-media card (MMC) protocol, a peripheral component interconnection (PCI) protocol, a PCT express (PCI-E) protocol, an advanced technology attachment (ATA) protocol, a serial-ATA protocol, a parallel-ATA protocol, a small computer system interface (SCSI) protocol, an enhanced small disk interface (ESDI) protocol and an integrated drive electronics (IDE) protocol.

In some implementations, the memory system 100 may be applied to different types of electronic devices such as a mobile phone (e.g., a cellphone), a desktop computer, a tablet computer, a laptop computer, a server, a vehiclemounted device, a gaming console, a printer, a positioning device, a wearable device, a smart sensor, a mobile power source, a virtual reality (VR) device, an augmented reality (AR) device, and any electronic device capable of data storage, for example, a processor.

Examples of the present application provide a method of operating a memory, a memory and a memory system. In the method provided in implementations of the present application, coarse sensing on the memory cells is omitted at each reading period of the AVD reading, so that the time needed for the AVD reading is reduced and the speed of the AVD reading is improved. Furthermore, the result of the fine sensing of the first reading period is taken as the result of the coarse sensing of the second reading period, so that the time needed for the AVD reading is reduced while the accuracy of the AVD reading is guaranteed. In some examples, the result of the fine sensing of the second reading period may also be taken as the result of the coarse sensing of the third reading period in implementations of the present application.

The present application further provides a computer readable storage medium having computer executable instructions stored thereon, which, when being executed, can implement the method shown in FIG. 8, FIG. 10 and FIG. 12.

An example of the present disclosure provides a computer device including a processor and a readable storage medium coupled to the processor. The readable storage medium stores executable instructions, which, when executed by the processor, can implement the method shown in FIG. 8, FIG. 10 and FIG. 12.

It can be appreciated by those skilled in the art that, for convenience and simplicity of description, the examples above have been described with their respective emphases and some contents that have not been detailed in one example may be found in the corresponding processes of the foregoing method examples and will not repeated here.

In several examples of the present application, it should be understood that the provided method, memory and memory system may be implemented in other ways. For example, division of modules is only done in a logical function, and the actual division may be done in other ways. For example, multiple units or components may be combined or be integrated into another system, and some features may be omitted or not executed.

It can be appreciated by those skilled in the art that various example modules and algorithm operations described in connection with examples disclosed herein can be implemented in electronic hardware or a combination of computer software and electronic hardware. Whether to implement those functions in hardware or software depends on the specific application and design constraints of the technical solutions. Professionals may use a different method to achieve the functions for each particular application without departing from the scope of the application.

What have been described above are only implementations of the present application. However, the scope of the present application is not limited thereto, and variations or substitutions that easily occur to those skilled in the art within the technical scope disclosed by the present application should be encompassed in the scope claimed by the present application. Therefore, the scope of the present application should be determined by the scope of the claims.

What is claimed is:

1. A method of operating a memory, comprising:
at a first reading period, performing a sensing operation on memory cells based on a first read voltage, a sensing development duration for the sensing operation performed on the memory cells being not shorter than a first development duration, and the memory cells comprising a first memory cell group, a second memory cell group and a third memory cell group, wherein
at a first sensing period of the first reading period, first data is obtained in the first memory cell group based on a second development duration, second data is obtained in the second memory cell group based on a third development duration, and third data is obtained in the third memory cell group based on a fourth development duration,
at a second sensing period of the first reading period, fourth data is obtained in the first memory cell group based on the first development duration, fifth data is obtained in the second memory cell group based on the second development duration, and sixth data is obtained in the third memory cell group based on the third development duration,
based on the first data and the fourth data, a number of first memory cell is determined in the first memory cell group with a threshold voltage of the first memory cell being between a first voltage and a second voltage;
based on the second data and the fifth data, a number of second memory cell is determined in the second memory cell group with a threshold voltage of the second memory cell being between the second voltage and a third voltage;
based on the third data and the sixth data, a number of third memory cell is determined in the third memory cell group with a threshold voltage of the third memory cell being between the third voltage and a fourth voltage; and
based on the number of the first memory cell, the number of the second memory cell and the number of the third memory cell, a valley voltage between a first threshold voltage distribution range and a second threshold voltage distribution range is determined.

2. The method of claim 1, further comprising:
at a second reading period, performing a sensing operation on the memory cells based on a second read voltage different from the first read voltage.

3. The method of claim 2, wherein at the second reading period, the sensing operation on the memory cells having threshold voltages not larger than one of the first and second voltages in the first memory cell group is prohibited.

4. The method of claim 2, wherein at the second reading period, the sensing operation on the memory cells having threshold voltages not larger than one of the second and third voltages in the second memory cell group is prohibited.

5. The method of claim 2, wherein at the second reading period, the sensing operation on the memory cells having threshold voltages not larger than one of the third and fourth voltages in the third memory cell group is prohibited.

6. The method of claim 1, wherein the memory comprises a page buffer coupled to the memory cells in the first memory cell group, and obtaining the first data further comprises:
at the first sensing period of the first reading period, discharging a sensing node in the page buffer after the sensing node have been charged;
after the second development duration, latching a sensing information into a first latch circuit of the page buffer according to a voltage of the sensing node; and
obtaining the first data according to the sensing information latched by the first latch circuit.

7. The method of claim 6, wherein obtaining the fourth data further comprises:

at the second sensing period of the first reading period, discharging the sensing node after the sensing node have been charged;

after the first development duration, latching sensing information into a second latch circuit of the page buffer according to the voltage of the sensing node; and obtaining the fourth data according to the sensing information latched by the second latch circuit.

8. The method of claim 1, wherein the memory comprises a page buffer coupled to the memory cells in the second memory cell group, and determining the number of second memory cell in the second memory cell group further comprises:

at the first sensing period of the first reading period, discharging a sensing node in the page buffer after the sensing node have been charged; after the third development duration, latching sensing information into a first latch circuit of the page buffer according to a voltage of the sensing node to obtain the second data;

at the second sensing period of the first reading period, discharging the sensing node after the sensing node have been charged; after the second development duration, latching sensing information into a second latch circuit of the page buffer according to the voltage of the sensing node to obtain the fifth data; and determining the number of second memory cell according to the second data and the fifth data.

9. The method of claim 3, wherein the memory comprises a page buffer coupled to the memory cells in the first memory cell group; and at the second reading period, prohibiting the sensing operation on the memory cells having threshold voltages not larger than one of the first and second voltages in the first memory cell group further comprises:

at the first sensing period of the first reading period, discharging a sensing node in the page buffer after the sensing node have been charged; after the second development duration, latching sensing information into a first latch circuit of the page buffer according to a voltage of the sensing node;

at the second sensing period of the first reading period, discharging the sensing node after the sensing node have been charged; after the first development duration, latching sensing information into a second latch circuit of the page buffer according to the voltage of the sensing node; and at the second reading period, prohibiting the sensing node from being charged according to the sensing information latched by one of the first and second latch circuits.

10. The method of claim 4, wherein the memory comprises a page buffer coupled to the memory cells in the second memory cell group; and at the second reading period, prohibiting the sensing operation on the memory cells having threshold voltages not larger than one of the second and third voltages in the second memory cell group further comprises:

at the first sensing period of the first reading period, discharging a sensing node in the page buffer after the sensing node have been charged; after the third development duration, latching sensing information into a first latch circuit of the page buffer according to a voltage of the sensing node;

at the second sensing period of the first reading period, discharging the sensing node after the sensing node have been charged; after the second development duration, latching sensing information into a second latch circuit of the page buffer according to the voltage of the sensing node; and at the second reading period, prohibiting the sensing node from being charged according to the sensing information latched by one of the first and second latch circuits.

11. The method of claim 9, wherein at the second reading period, prohibiting the sensing node from being charged according to the sensing information latched by one of the first and second latch circuits further comprises:

at the first sensing period of the first reading period, latching the sensing information latched by one of the first and second latch circuits into a third latch circuit of the page buffer; before the second reading period, transferring the sensing information latched by the third latch circuit to the first latch circuit; and at the second reading period, prohibiting the sensing node from being charged according to the sensing information latched by the first latch circuit.

12. The method of claim 2, further comprising:

at the second reading period, prohibiting the sensing operation on the memory cells having threshold voltages larger than one of the first and second voltages in the first memory cell group.

13. The method of claim 2, further comprising:

at the second reading period, prohibiting the sensing operation on the memory cells having threshold voltages larger than one of the second and third voltages in the second memory cell group.

14. The method of claim 2, further comprising:

at the second reading period, prohibiting the sensing operation on the memory cells having threshold voltages larger than one of the third and fourth voltages in the third memory cell group.

15. The method of claim 2, further comprising:

at the second reading period, the sensing development duration for the sensing operation performed on the memory cells is not shorter than a fifth development duration, wherein, at a first sensing period of the second reading period, seventh data is obtained in the first memory cell group based on a sixth development duration, eighth data is obtained in the second memory cell group based on a seventh development duration, and ninth data is obtained in the third memory cell group based on an eighth development duration;

at a second sensing period of the second reading period, tenth data is obtained in the first memory cell group based on the fifth development duration, eleventh data is obtained in the second memory cell group based on the sixth development duration, and twelfth data is obtained in the third memory cell group based on the seventh development duration;

based on the seventh data and the tenth data, a number of fourth memory cell is determined in the first memory cell group with a threshold voltage of the fourth memory cell being between a fifth voltage and a sixth voltage;

based on the eighth data and the eleventh data, a number of fifth memory cell is determined in the second memory cell group with a threshold voltage of the fifth memory cell being between the sixth voltage and a seventh voltage;

based on the ninth data and the twelfth data, a number of sixth memory cell is determined in the third memory cell group with a threshold voltage of the sixth memory cell being between the seventh voltage and an eighth voltage; and based on the number of the fourth memory cell, the number of the fifth memory cell and the number of the sixth memory cell, a valley voltage between a third threshold voltage distribution range and a fourth threshold voltage distribution range is determined with the third threshold voltage distribution range being adjacent to the fourth threshold voltage distribution range.

16. A memory, comprising a memory array and a peripheral circuit coupled to the memory array, wherein the memory array comprises memory cells and a word line coupled to the memory cells and the peripheral circuit is configured to:

at a first reading period, perform a sensing operation on the memory cells based on a first read voltage, a sensing development duration for the sensing operation performed on the memory cells being not shorter than a first development duration, and the memory cells comprising a first memory cell group, a second memory cell group and a third memory cell group, and wherein, at a first sensing period of the first reading period, first data is obtained in the first memory cell group based on a second development duration, second data is obtained in the second memory cell group based on a third development duration, and third data is obtained in the third memory cell group based on a fourth development duration, at a second sensing period of the first reading period, fourth data is obtained in the first memory cell group based on the first development duration, fifth data is obtained in the second memory cell group based on the second development duration, and sixth data is obtained in the third memory cell group based on the third development duration, based on the first data and the fourth data, a number of first memory cell is determined in the first memory cell group with a threshold voltage of the first memory cell being between a first voltage and a second voltage;

based on the second data and the fifth data, a number of second memory cell is determined in the second memory cell group with a threshold voltage of the second memory cell being between the second voltage and a third voltage;

based on the third data and the sixth data, a number of third memory cell is determined in the third memory cell group with a threshold voltage of the third memory cell being between the third voltage and a fourth voltage; and based on the number of the first memory cell, the number of the second memory cell and the number of the third memory cell, a valley voltage between a first threshold voltage distribution range and a second threshold voltage distribution range is determined with the first threshold voltage distribution range being adjacent to the second threshold voltage distribution range.

17. The memory of claim 16, wherein the peripheral circuit is further configured to:

at a second reading period, perform a sensing operation on the memory cells based on a second read voltage different from the first read voltage.

18. The memory of claim 16, wherein the peripheral circuit comprise a page buffer coupled to the memory cells of the first memory cell group, and the page buffer comprises a sensing node, a charging and discharging circuit and a first latch circuit with the charging and discharging circuit and the first latch circuit being coupled to the sensing node;

at the first sensing period of the first reading period, the charging and discharging circuit is configured to discharge the sensing node after the sensing node have been charged;

the first latch circuit is configured to latch sensing information according to a voltage of the sensing node after the second development duration; and the first data is obtained according to the sensing information latched by the first latch circuit.

19. The memory of claim 16, wherein the peripheral circuit comprises a page buffer coupled to the memory cells of the second memory cell group and the page buffer comprises a sensing node, a charging and discharging circuit and a first latch circuit and a second latch circuit with the charging and discharging circuit, the first latch circuit and the second latch circuit being coupled to the sensing node;

at the first sensing period of the first reading period, the charging and discharging circuit is configured to discharge the sensing node after the sensing node have been charged; the first latch circuit is configured to latch sensing information according to a voltage of the sensing node after the third development duration to obtain the second data;

at the second sensing period of the first reading period, the charging and discharging circuit is configured to discharge the sensing node after the sensing node have been charged; the second latch circuit is configured to latch sensing information according to the voltage of the sensing node after the second development duration to obtain the fifth data; and the number of the second memory cell is determined according to the second data and the fifth data.

20. A memory system, comprising:

a memory controller; and a memory, comprising a memory array and a peripheral circuit coupled to the memory array, wherein the memory array comprises a memory cell and a word line coupled to the memory cell and the peripheral circuit is configured to:

at a first reading period, perform a sensing operation on memory cells based on a first read voltage, a sensing development duration for the sensing operation performed on the memory cells being not shorter than a first development duration, and the memory cells comprising a first memory cell group, a second memory cell group and a third memory cell group, and wherein, at a first sensing period of the first reading period, first data is obtained in the first memory cell group based on a second development duration, second data is obtained in the second memory cell group based on a third development duration, and third data is obtained in the third memory cell group based on a fourth development duration, at a second sensing period of the first reading period, fourth data is obtained in the first memory cell group based on the first development duration, fifth data is obtained in the second memory cell group based on the second development duration, and sixth data is obtained in the third memory cell group based on the third development duration, based on the first data and the fourth data, a number of first memory cell is determined in the first memory cell group with a threshold voltage of the first memory cell being between a first voltage and a second voltage;

based on the second data and the fifth data, a number of second memory cell is determined in the second memory cell group with a threshold voltage of the second memory cell being between the second voltage and a third voltage;

based on the third data and the sixth data, a number of third memory cell is determined in the third memory cell group with a threshold voltage of the third memory cell being between the third voltage and a fourth voltage; and based on the number of the first memory cell, the number of the second memory cell and the number of the third memory cell, a valley voltage between a first threshold voltage distribution range and a second threshold voltage distribution range is determined with the first threshold voltage distribution range being adjacent to the second threshold voltage distribution range, wherein the memory controller is configured to control the memory.

* * * * *